(12) United States Patent
Mukunoki et al.

(10) Patent No.: US 7,285,314 B2
(45) Date of Patent: Oct. 23, 2007

(54) STEAM BARRIER FILM

(75) Inventors: Yasuo Mukunoki, Minami-ashigara (JP); Hiroshi Iwanaga, Minami-ashigara (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/363,331

(22) Filed: Feb. 28, 2006

(65) Prior Publication Data

US 2006/0204772 A1 Sep. 14, 2006

(30) Foreign Application Priority Data

Feb. 28, 2005 (JP) ............................. 2005-054752

(51) Int. Cl.
| B32B 18/00 | (2006.01) |
| B32B 27/06 | (2006.01) |
| B32B 27/08 | (2006.01) |
| B32B 27/36 | (2006.01) |
| B32B 27/18 | (2006.01) |

(52) U.S. Cl. ................... 428/36.6; 428/36.7; 428/328; 428/329; 428/446; 428/457; 428/458; 428/469; 428/472; 428/480

(58) Field of Classification Search ...................... None
See application file for complete search history.

(56) References Cited

U.S. PATENT DOCUMENTS 4,493,875 A * 1/1985 Beck et al. ................. 428/403
4,663,192 A * 5/1987 Hatakeyama et al. ....... 427/108
4,878,765 A * 11/1989 Watkins et al. ............. 383/116
5,279,873 A * 1/1994 Oike .......................... 428/35.4
5,314,561 A * 5/1994 Komiya .................. 156/244.11
5,380,577 A * 1/1995 Hamano et al. ............ 428/143
5,387,449 A * 2/1995 Kunz et al. ................. 428/35.4
5,440,446 A * 8/1995 Shaw et al. ............... 361/301.5
5,607,789 A * 3/1997 Treger et al. ................. 429/90
5,770,301 A * 6/1998 Murai et al. ................. 428/213
5,853,642 A * 12/1998 Siedle et al. ................. 264/236
5,853,862 A * 12/1998 Murai et al. ................. 428/215
5,858,940 A * 1/1999 Orcutt ........................ 510/171
5,942,230 A * 8/1999 Wu et al. ................. 424/182.1
6,432,516 B1 * 8/2002 Terasaki et al. .......... 428/195.1
6,494,054 B1 * 12/2002 Wong et al. ................... 62/335
6,905,769 B2 * 6/2005 Komada ..................... 428/421
7,022,388 B2 * 4/2006 Hashimoto et al. ......... 428/34.9
2004/0241454 A1 * 12/2004 Shaw et al. ............... 428/425.5
2005/0100723 A1 * 5/2005 Tanaka et al. ............... 428/220
2005/0214556 A1 * 9/2005 Nishimi et al. .............. 428/500
2006/0225783 A1 * 10/2006 Iwanaga ..................... 136/263
2006/0226517 A1 * 10/2006 Iwanaga et al. ............. 257/639
2007/0026243 A1 * 2/2007 Iwanaga et al. ............. 428/446

* cited by examiner

Primary Examiner—Vivian Chen
(74) Attorney, Agent, or Firm—Birch, Stewart, Kolasch & Birch, LLP

(57) ABSTRACT

A steam barrier film comprising at least one inorganic gas barrier layer on a polyalkylene naphthalate resin substrate film in which the glass transition temperature (Tg) of the polyalkylene naphthalate resin is from 70 to 150° C. and the steam barrier film comprises at least one conductive layer with a resistance of $10^{12}$ Ω or less at 25° C. and 60% relative humidity.

18 Claims, 1 Drawing Sheet

STEAM BARRIER FILM

BACKGROUND OF THE INVENTION

The present disclosure relates to the subject matter contained in Japanese Patent Application No. 054752/2005 filed on Feb. 28, 2005, which is expressly incorporated herein by reference in its entirety.

1. Field of the Invention

The present invention relates to a steam barrier film and, more specifically, it relates to a laminate type steam barrier film suitable to substrates for various kinds of devices and coating films for the devices. Further, the invention also relates to a substrate for use in image display devices and organic EL devices excellent in durability and flexibility and, more particularly, relates to a substrate excellent in handleability with no electrostatic troubles.

2. Description of the Related Art

Gas barrier films in which thin films of metal oxide such as aluminum oxide, magnesium oxide, and silicon oxides are formed on the surfaces of plastic substrates or films have been generally used so far for packaging of articles requiring shielding of steams or various gases such as oxygen, or packaging application for preventing denaturation of foodstuffs, industrial products, and medicines. Further, the gas barrier films have also been started for use in substrates of liquid crystal display devices, solar cells or electroluminescence (EL) devices in addition to the packaging use. Particularly, in transparent substrates which have been applied progressively to liquid crystal display devices, EL devices, etc., high level of demands such as long time reliability, high degree of freedom in view of shape, and capability of display on a curved surface have been required in addition to the demand for reduction in the weight and increase in the size.

Recently, in the field of the liquid crystal display devices, the EL devices, etc., film substrates such as those made of transparent plastics are being used instead of glass substrates, which are heavy, have a tendency to crack and present difficulties in increasing the area. Further, since the plastic substrates such as made of transparent plastics can not only cope with the requirements described above but also can be applicable to the roll-to-roll system, they are advantageous over glass materials in view of the productivity and the reduction of cost. However, film substrates such as of transparent plastics involve a problem of poor gas barrier properties in comparison with glass. Since steam or air permeates in a case of a substrate of poor gas barrier property, when it is used for example on a liquid crystal display device, liquid crystals in a liquid crystal cell are deteriorated and deteriorated portions result in display defects that deteriorate the display quality.

For solving such problems, it has been known to form a thin film of a metal oxide on the film substrate described above, and use the gas barrier film as a transparent substrate. As gas barrier films used for packaging materials and liquid crystal display devices, those formed by vapor depositing silicon oxide on a plastic film (for example, in JP-B-53-12953 (p1 to p3) (Patent Document 1) and those formed by vapor depositing aluminum oxide (for example, in JP-A-58-21734 (p1 to p4) (Patent Document 2)) are known and they have a steam barrier property of about 1 g/m$^2$/day. However, the steam barrier property as low as about 0.1 g/m$^2$/day has been demanded recently for the film substrate along with increase in the size of liquid crystal displays or development for highly fine displays.

Further, most recently, development has been progressed, for example, in organic EL displays or highly fine color liquid crystal displays requiring further higher barrier property and it has been demanded for a substrate having a performance of higher barrier property, particularly, a steam barrier property of less than 0.1 g/m$^2$/day while maintaining transparency usable therein. For coping with such a demand, films deposition by way of a sputtering method or a CVD method of forming a thin film using plasmas generated by glow discharge under low pressure conditions have been studied as means capable of expecting highly barrier performance. Further, it has been proposed a technique of preparing a barrier film having an alternate lamination structure of organic layer/inorganic layer by a vacuum vapor deposition method (for example, refer to U.S. Pat. No. 6,413,645B1 (p4, [2-54] to p8, [8-22]) (Patent Document 3) and "Thin Solid films" written by Affinito, et al., (1996), p. 290 to 291 (p63 to p67) (Non-Patent Document 1)).

On the other hand, it has also been disclosed a technique of not only inhibiting intrusion of steams from the outside but also positively capturing water by forming a film of a moisture absorbent to the inner lateral surface of a sealing member (refer, for example, to JP-A-2000-260562 (p3 to p5) (Patent Document 4)). However, since the barrier performance of the sealant or the substrate is still insufficient also in such techniques, they give rise to a problem of causing film deformation by moisture absorption after lapse of long time to result in fetal deterioration of image quality as displays. Further, they also involve a problem that metal ions forming the hygroscopic layer diffuse during device manufacturing steps or during use to deteriorate the performance and, in this sense, it has been desired for the development of a technique capable of compatibilizing transparently and high hygroscopic performance and high barrier performance.

Further, problems in such substrates also include deposition of dusts caused in the course of manufacture which worsen the substrate performance (barrier property). Further, they also give rise to a problem that not only dusts are deposited due to electrostatic charges during handling of the substrate but also generation of electrostatic troubles to the substrates by the generation of static electricity to bring about troubles in view of the characteristics. Further, highly heat resistance substrates developed in recent years involve the problem in view of the cost for the substrate film, which results in remarkable hindrance in the provision of actual commercial products. Accordingly, there has been a demand for steam barrier films capable of using substrate films at a low cost and favorable in the handleability.

SUMMARY OF THE INVENTION

For overcoming the foregoing problems, the present invention intends to provide a steam barrier film with less deposition of dusts, etc. and having high barrier property and transparency. It particularly intends to provide a technique capable of attaining a steam barrier film reduced in the cost and excellent in the transparency. Further, the invention intends to provide a substrate for use in image display devices and organic electroluminescence devices not generating electrostatic troubles in the course of manufacture or during handling, as well as free of deterioration of image quality due to film deformation or change of transparency caused by moisture absorption even during long time use. Further, it intends to utilize a material reduced in the cost for the substrate film to be used and easily available in the market.

The present invention has been achieved in accordance with the followings.

(1) A steam barrier film comprising at least one inorganic gas barrier layer on a polyalkylene naphthalate resin substrate film in which the glass transition temperature (Tg) of the polyalkylene naphthalate resin is from 70 to 150° C. and the steam barrier film comprises at least one conductive layer with a resistance of $10^{12}\Omega$ or less at 25° C. and 60% relative humidity.

(2) A steam barrier film according to (1), wherein the inorganic gas barrier layer contains an oxide, nitride or oxynitride containing at least one metal selected from the group consisting of Si, Al, In, Sn, Zn, Ti, Cu, Ce and Ta.

(2') The steam barrier film according to (2) wherein the inorganic gas barrier film is a layer prepared by a sputtering method, vacuum vapor deposition method, ion plating method or plasma CVD method.

(3) The steam barrier film according to (1) or (2), wherein the substrate film is transparent and comprises a polyalkylene naphtharate resin with the glass transition temperature of from 85 to 150° C.

(4) The steam barrier film according to any one of (1) to (3), wherein the polyalkylene naphthalate resin substrate film is a polyethylene naphthalate film.

(5) The steam barrier film according to any one of (1) to (4), wherein the conductive layer contains at least one inorganic conductive metal oxide and/or at least one organic conductive material.

(6) The steam barrier film according (5), wherein the conductive metal oxide is $ZnO$, $TiO_2$, $SnO_2$, $Al_2O_3$, $In_2O_3$, $SiO_2$, $MgO$, $BaO$, $MoO_2$, $V_2O_5$ or a composite oxide thereof and the metal oxide may also contain a heteroatom selected from the group consisting of Al, In, Ta, Sb, Nb, Ag, Cl, Br, and I.

(7) The steam barrier film according to any one of (1) to (6), wherein the steam barrier film has at least two inorganic gas barrier layers and at least one hygroscopic layer containing a monoxide of group II metal between the inorganic gas barrier layers.

(8) The steam barrier film according to any one of (1) to (7), which comprises at least one adjacent organic layer in a position adjacent to the inorganic gas barrier layer and/or a hygroscopic layer.

(9) The steam barrier film according to (7) or (8), wherein the hygroscopic layer contains at least one metal oxide comprising Be, Mg, Ca, Sr, Ba or Ra.

(10) An optical display material comprising the steam barrier film according to any one of (1) to (9).

The steam barrier film according to the invention is not susceptible to the adhesion of dusts, has excellent barrier property, and is excellent in the antistatic characteristic. Particularly, the invention can provide a steam barrier film of high transparency at a reduced cost. Further, the optical display material according to the invention results in no electrostatic troubles in the course of manufacture or during handling and does not deteriorate image quality even in long time use.

BEST MODE FOR CARRYING OUT THE INVENTION

Figure 1:
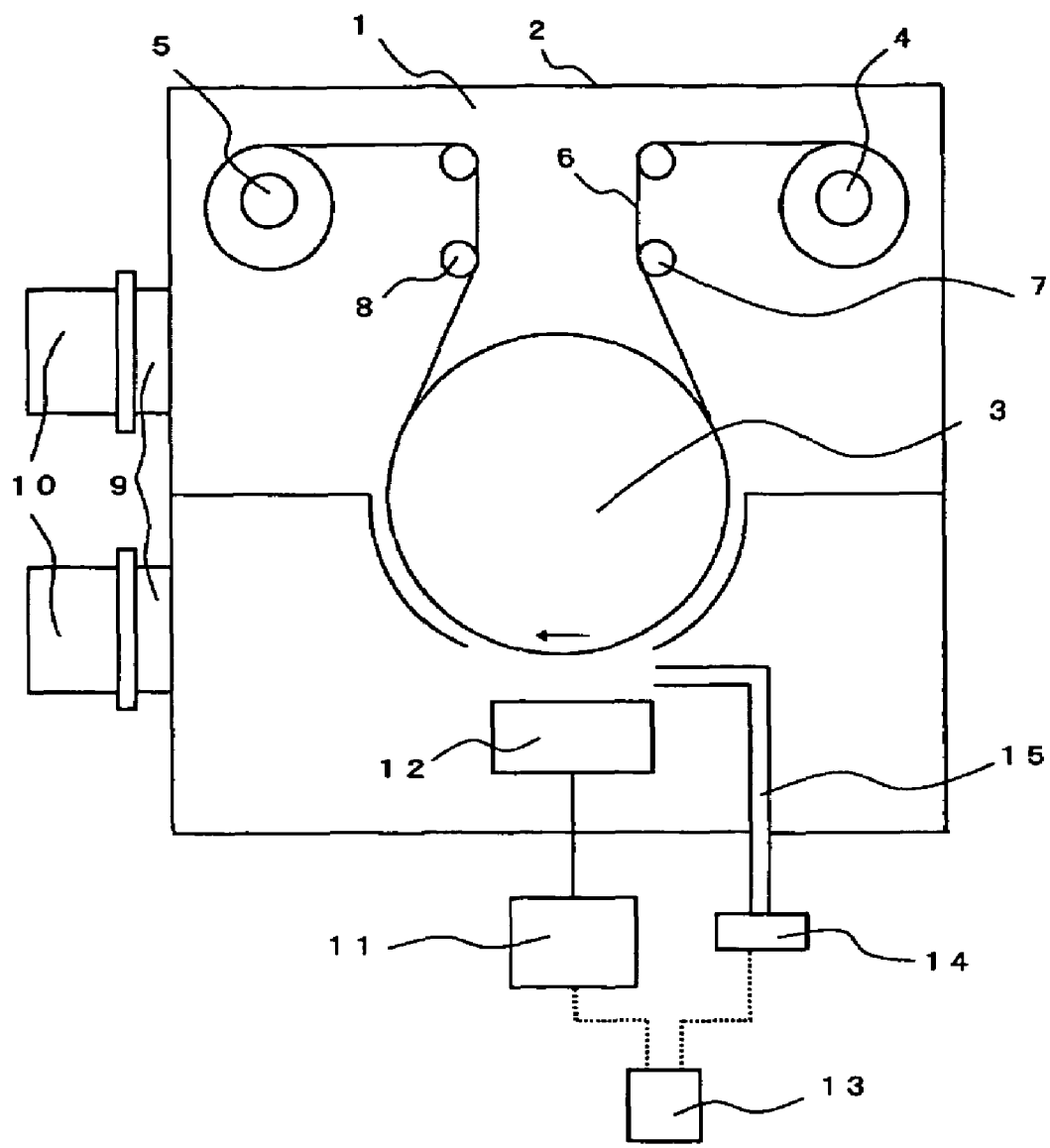
FIG. 1 is an explanatory view showing a sputtering apparatus used in the example.

At first, the steam barrier film according to the present invention is to be described specifically. Explanation for the constituent factors to be described later are sometimes based on typical embodiments of the invention but the invention is not restricted to such embodiments. In the specification, ranges for numeral values represented by " - - - - to - - - " means ranges including numeral values described before and after "to" as the lower limit value and the upper limit value.

(Steam Barrier Film)

The steam barrier film of the invention comprises at least one inorganic gas barrier layer, preferably at least two inorganic gas barrier layers, on a substrate film. More preferably, at least one hygroscopic layer comprising a monoxide of group II metal is present between the two inorganic gas barrier layers to develop preferred steam barrier characteristic. The steam barrier film of the invention is a laminate type steam barrier film and, particularly, a further higher gas barrier performance and a hygroscopic performance can be obtained by providing a hygroscopic layer comprising a monoxide of group II metal between at least two inorganic gas barrier layers. That is, the steam barrier film of the invention preferably has at least two inorganic gas barrier layers on a substrate film and, more preferably, has also at least one hygroscopic layer.

Now, each of the layers constituting the steam barrier film is to be described specifically with reference to a steam barrier film having at least two inorganic gas barrier layers on a substrate film as an example.

(Inorganic Gas Barrier Layer)

"Inorganic gas barrier layer" in the invention means a layer constituted with a thin film of a dense structure comprising an inorganic material capable of suppressing permeation of gas molecules and includes, for example, a thin film comprising a metal compound (thin metal compound film). For the method of forming the inorganic gas barrier layer, any method capable of forming an aimed thin film can be used, and a sputtering method, a vacuum deposition method, an ion plating method, a plasma CVD method, etc. are suitable, for example, to the forming method and, specifically, the forming method described in each of the publications of Japanese Patent No. 3400324, JP-A-2002-322561 and JP-A-2002-361774 can be adopted.

Ingredients contained in the inorganic gas barrier layer are not particularly limited so long as they can satisfy the performance described above and, for example, oxides, nitrides, oxynitrides containing one or more of metals selected, for example, from Si, Al, In, Sn, Zn, Ti, Cu, Ce, and Ta can be used. Among them, oxides of metals selected from the group consisting of Si, Al, In, Sn, Zn, and Ti are preferred and, particularly, oxides of metals selected from Si, Al, Sn, and Ti are preferred.

Further, the thickness of the inorganic gas barrier layer is not particularly limited as well. Since cracks may be resulted due to bending stress in a case where the thickness is excessive and since films are distributed in an island shape in a case where it is excessively thin, the steam barrier property tends to be worsened in each of the cases. Accordingly, the thickness for each of the inorganic gas barrier layers is within a range, preferably, from 5 nm to 1000 nm, more preferably, from 10 nm to 1000 nm and, most preferably, from 10 nm to 200 nm. Further, two or more kinds of inorganic gas barrier layers may be of a composition identical with each other or compositions different from each other with no particular restriction. In this case, the inorganic gas barrier may also contain carbon-containing metal oxides.

In the invention, silicon oxide, silicon nitride or silicon oxynitride is used preferably as the inorganic gas barrier layer for making the steam barrier property and the high transparency compatible. In a case of using $SiO_x$ which is silicon oxide as the inorganic gas barrier layer, it is preferred that $1.6<x<1.9$ for making a good steam barrier property and high light transmittance compatible. In a case of using $SiN_y$ which is silicon nitride as the inorganic gas barrier layer, $1.2<y<1.3$ is preferred. In a case y is greater than 1.2, since coloration tends to be decreased relatively, it is suitable to display use.

Further, in a case of using $SiO_xN_y$ which is silicon oxynitride as the inorganic gas barrier layer, an oxygen-rich film is preferred in a case where an importance is attached to the improvement of adhesion and, specifically, it preferably satisfies: $1<x<2$ and $0<y<1$. On the other hand, in a case where an importance is attached to the improvement of the steam barrier property, a nitrogen-rich film is preferred and, specifically, it is preferred to satisfy $0<x<0.8$ and $0.8<y<1.3$.

(Hygroscopic Layer)

The steam barrier film in the invention more preferably, has "hygroscopic layer" and a preferred hygroscopic layer in this case includes layers constituted with monoxide of group II metals. The group II metal in the monoxide of group II metal includes Be, Mg, Ca, Sr, Ba, and Ra. While any of the group II metals can be used in the invention, Mg, Ca, Sr, and Ba are suitable in view of the cost, availability for high purity materials, and practical usefulness. Ca and Sr are more preferred with the view point of the hygroscopic performance and safety and Sr is most preferred.

"Monoxide of group II metal" is an oxide in which oxygen is bonded by about one atom to one atom of the metal. Expressing the group II metal as "M", the composition of the hygroscopic layer can be expressed as "$MO_z$". z preferably satisfies $0.8<z<1.2$ and most preferably satisfies $0.9<z<1.1$. It is most preferred to satisfy $0.9<z<1.1$. The monoxide of group II metal has a feature in that sufficiently high hygroscopic performance and transparency are compatible, and the volumic change is relatively small before and after moisture absorption. Further, since diffusion in the layer less occurs compared with alkali metals, it is suitable for application use to device materials in which diffusion of ionic metals should be avoided. Further, since it in-takes molecules of water into the molecule not by way of physical adsorption as in silica gel or zeolite, absorbed molecules of water are not re-desorbed and this is suitable to the purpose of the invention.

As the film forming method for the hygroscopic layer, a method of coating a dispersion of a monoxide of group II metal and then sintering the same at a high temperature of 400° C. or higher may be adopted. In this case, however, the substrate film may sometimes undergo restriction in view of the heat resistance, or handling of the high hygroscopic material in an inert atmosphere may sometimes be difficult. Accordingly, with a view point of obtaining a stable performance, the hygroscopic layer is preferably formed by a vacuum film forming method to be described later. The vacuum film forming method includes, for example, a method of vacuum vapor depositing a source of the monoxide of group II metal, a method of vacuum vapor depositing a group II metal or partial oxide thereof in an oxidative atmosphere, or a method of vacuum vapor depositing a peroxide of group II metal. Further, in the vacuum depositing method, an ion plating method combined with ion assisting may also be adopted. As the vacuum film forming method, a sputtering method using a peroxide of group II metal easy for the handling of the source and capable of film deposition at good quality as a target as described in JP-A-2000-26562 is most preferred.

A hygroscopic layer in which an inorganic compound such as $SiO_x$, $SiN_y$, $SiO_xN_y$, and SiC is present together with the monoxide of group II metal may be formed by a co-vapor deposition method or a co-sputtering method, or a hygroscopic layer in which anhydrous acetic acid or acetoacetic acid is present together with the monoxide of group II metal may be formed by a coating method. However, the hygroscopic layer in which the monoxide of group II metal is formed solely into a film according to the invention is excellent in the uniformess, transparency and oxygen barrier property.

The thickness of the hygroscopic layer is, preferably, from 10 nm to 200 nm, more preferably, from 10 nm to 100 nm and, particularly preferably, from 10 nm to 50 nm with a view point of hygroscopicity, smoothness, transparency, and bending resistance. In a case where the thickness of the hygroscopic layer is 10 nm or less, it may sometimes be difficult to form a continuous layer with the monoxide of group II metal and the hygroscopic performance may sometimes be insufficient to obtain a sufficient effect. On the other hand, in a case where the thickness of the hygroscopic layer exceeds 200 nm, defects may sometimes occur easily in which peeling fracture, whitening or optical interference pattern are recognized to sometimes result in fetal defects for the display material.

The hygroscopic layer is preferably a uniform layer. It is particularly preferred to be a uniform layer at a thickness of from 10 nm to 200 nm. "Uniform layer" means a layer in which the composition in the layer is uniform. The uniform layer has an advantage of less causing dynamically or optically discontinuous boundary and suitable as a display material.

(Adjacent Organic Layer)

In the steam barrier film of the invention, an adjacent organic layer can be provided so as to be adjacent with the inorganic gas barrier layer and/or hygroscopic layer in order to improve the fragility or the barrier property of the inorganic gas barrier layer and/or the hygroscopic layer. The adjacent organic layer is preferably formed by coating or vapor depositing a UV-ray or electron beam-curable monomer, oligomer or resin and then curing the same by UV-rays or electron beams.

Description is to be made for the adjacent organic layer in a case of using an adjacent organic layer formed of a polymer obtained by crosslinking monomers as a main ingredient as an example. While monomer is not particularly limited so long as the monomer has a group that can be crosslinked under irradiation of UV-rays or electron beams, use of monomers having an acryloyl group, methacryloyl group, or oxetane group is preferred. The organic layer preferably comprises, as the main ingredient, a polymer obtained by crosslinking monomers having 2- or higher functional acryloyl group or methacryloyl group, for example, among epoxy(meth)acrylate, urethane(meth)acrylate, isocyanuric acid (meth)acrylate, pentaerythritol(meth) acrylate, trimethyloyl propane(meth)acrylate, ethylene glycol (meth)acrylate, and polyester (meth)acrylate.

Two or more of bifunctional or higher functional monomers having acryloyl group or methacryloyl group may be used in admixture, or mono-functional (meth)acrylates may be used in admixture. Further, the monomer having the oxetane group suitably includes monomers, for example, having structures of the general formulae (3) to (6) as described in JP-A-2002-356607. In this case, they may be mixed optionally.

The adjacent organic layer comprises, more preferably, isocyanuric acid acrylate, epoxy acrylate, and urethane acrylate as the main ingredient having high degree of crosslinking and a glass transition temperature of 200° C. or higher with a view point of heat resistance and solvent resistance required for the display application. Also for the thickness of the adjacent organic layer it is not particularly limited. However, since it is difficult to obtain uniform thickness in a case where the thickness of the adjacent organic layer is excessively thin, the structural defects in the inorganic gas layer can not be buried efficiently with the adjacent organic layer and no improvement can be observed for the barrier property. On the contrary, in a case where the thickness of the adjacent organic layer is excessively large, since cracks are tend to be resulted in the adjacent organic layer due to external force such as bending, a disadvantage of lowering the barrier property may occur. With the view point, the thickness of the adjacent organic layer is, preferably, from 10 nm to 5000 nm, more preferably, from 10 nm to 2000 nm and, most preferably, from 10 nm to 5000 nm.

The method of forming the adjacent organic layer used preferably in the invention at first includes a method of forming a coating film containing a crosslinking monomer, etc. and then irradiating electron beams or UV-rays to the coating film thereby curing the film. The method of forming the coating film includes, for example, a coating method or a vacuum film forming method. While the vacuum film forming method is not particularly limited, a film forming method such as vapor deposition or plasma CVD is preferred and an ohmic heating vapor deposition method capable of easily controlling the film forming speed of the organic material monomer is more preferred. While the crosslinking method for the crosslinking monomer, etc. is not particularly limited, crosslinking by electron beams or UV-rays is desirable in that the system can be attached easily in the vacuum vessel or in that increase of molecular weight by crosslinking reaction is rapid.

In a case of coating the coating film by the coating method, various conventional coating methods used so far, for example, a method of spray coating, spin coating or bar coating can be used. While any coating method or vapor deposition may be used as the method of forming the coating film, it is preferred to use a vacuum film forming method that causes less mechanical stresses after forming the film of the inorganic gas barrier layer just below and that is advantageous for the formation of the thin film.

In the invention, so long as the hygroscopic layer is situated between the two inorganic gas barrier layers on the substrate film, it may be formed at any of the positions adjacent with the two inorganic gas barrier layers, adjacent with the inorganic gas barrier layer and the adjacent organic layer, or adjacent with the two adjacent organic layers. With a view point of decreasing the effect of fragility or deformation due to the volumic expansion after moisture absorption of the hygroscopic layer, it is most preferred that the hygroscopic layer is situated between the two inorganic gas barrier layers in the form adjacent with the two adjacent organic layers.

(Other Functional Layers and Constitution of Each Layer)

In the steam barrier film of the invention, a known primer layer or a thin inorganic film layer can be provided between the substrate film and the inorganic gas barrier film. The primer layer includes, for example, a resin layer such as of acrylic resin, epoxy resin, urethane resin, or silicone resin, an organic and inorganic hybrid layer formed by sol-gel reaction under the co-existence of a hydrophilic resin, an inorganic vapor deposition layer or a dense inorganic layer by a sol-gel method. As the inorganic vapor deposition layer, a vapor deposition layer of silica, zirconia, alumina or the like is preferred. The inorganic vapor deposition layer can be formed, for example, by a vacuum deposition method or a sputtering method.

(Substrate Film)

Then, the polyalkylene naphthalate resin substrate film constituting the steam barrier film of the invention is to be described. The polyalkylene naphthalate resin constituting the substrate film is formed of a dicarboxylic acid and a diol.

The dicarboxylic acid residue contains a naphthalene dicarboxylic acid residue as an essential ingredient. Preferably, 50 mol % to 100 mol % of the entire dicarboxylic acid residues comprise the naphthalene dicarboxylic acid residue. In the invention, those containing a phthalic acid residue together with a naphthalene dicarboxylic acid residue are preferred as the dicarboxylic acid residue of the polyalkylene naphthalate resin. The total amount of the naphthalene dicarboxylic acid resin and the phthalic acid residue is, preferably, from 70 mol % to 100 mol % of the entire dicarboxylic acid residue and, more preferably, from 80 mol % to 100 mol % of the entire dicarboxylic acid residue. The naphthalene dicarboxylic acid residue is, preferably, 2,6-naphthalene dicarboxylic acid residue and the phthalic acid residue is preferably a terephthalic acid residue.

For the diol, those containing an ethylene glycol residue by from 50 mol % to 100 mol %, more preferably, 70 mol % to 100 mol % and, further preferably, from 80 mol % to 100 mol % based on the entire diol residues are preferred.

Preferred specific examples of the polyalkylene naphthalate resins constituting the substrate film are to be described below but the resins usable in the invention are not restricted to them.

(Example of Homopolymer)

| HP-1: Polyethylene-2,6-naphthalate (PEN) | |
|---|---|
| | Composition (molar ratio) |
| (Examples of copolymer) | |
| CP-1: 2,6-NDCA/PTA/EG | (20/80/100) |
| CP-2: 2,6-NDCA/IPTA/EG | (80/20/100) |
| CP-3: 2,6-NDCA/TPA/EG | (80/20/100) |
| CP-4: 2,6-NDCA/EG/BPA.2EO | (100/25/75) |
| CP-5: 2,6-NDCA/EG/CHDM/BPA.2EO | (100/25/25/50) |
| CP-6: 2,6-NDCA/EG/CHDM | (100/80/20) |
| (Example of Polymer Blend) | |
| PB-1; PEN/PET | (80/20) |
| BP-2: PAr/PEN | (15/85) |
| BP-3: PAr/PCT/PEN | (15/10/75) |
| PB-4: PAr/PC/PEN | (10/10/80) |

(NDCA: naphthalate dicarboxylic acid, TPA: terephthalic acid, IPA: isophthalic acid, BPA.2EO: bisphenol A 2 ethylene oxide adduct, CHDM: cyclohexane dimethanol, EG: ethylene glycol)
(PEN: polyethylene naphthalate, PET: polyethylene terephthalate, PAr: polyallyrate, PCT: polycyclohexane dimethanol terephthalate, PC: Polycarbonate)

Preferred polyalkylene naphthalate resins are polyethylene naphthalate, polyethylene terephthalate/polyethylene naphthalate copolymer (CP-2), etc. and, particularly preferably, polyethylene naphthalate. The intrinsic viscosity of the polymer is, preferably, from 0.4 to 0.8, more preferably, from 0.45 to 0.7 and, further preferably, from 0.5 to 0.7.

The glass transition temperature (Tg) of the polyalkylene naphthalate resin constituting the substrate film is from 70 to 150° C., preferably, from 85 to 150° C., more preferably, from 75 to 150° C. and, further preferably, from 77 to 150° C. In a case where the glass transition temperature is lower than 70° C., it is disadvantageous in that the substrate film tends to be deformed easily by a heat treatment upon applying the functional layer. On the other hand, in a case where the glass transition temperature exceeds 150° C., it is disadvantageous in that stable planar shape can easily not be ensured upon film formation.

The polyalkylene naphthalate resin described above can be synthesized by heating a diacarboxylic acid ester (usually in a dimethyl ester form) and a diol as starting materials to 150° C. to 250° C. at an atmospheric pressure under the presence of an ester exchange reaction catalyst, allowing to react for 0.5 to 5 hours while distilling off by-produced methanol and then subjecting them to polycondensation reaction at a temperature of from 250° C. to 290° C. while gradually increasing the vacuum degree from the atmospheric pressure to 0.3 torr under stirring. The method of synthesizing the polyalkylene naphthalate resins can be conducted by reference, for example, to "Polymer Experimental Study" vol. 5, "Polycondensation and Polyaddition" (Kyoritsu Shuppan, 1980), p103 to p136, "Synthetic Polymer V" (Asakura Shoten, 1971), p187 to p286, and JP-A-5-16337, JP-A-3-179052, JP-A-2-3420, and JP-A-1-275628). The polyalkylene naphthalate resin thus polymerized is recovered, water cooled, solidified into a nudle shape and then cut into pellets.

The polyalkylene naphthalate resin used in the invention may also contain extremely fine particles and, in this case, they are preferably dispersed uniformly at a high concentration. Fine particles of from 1 nm to 400 nm, preferably, from 5 nm to 200 nm, more preferably, from 10 nm to 100 nm are added by from 10 mass % to 60 mass %, more preferably, from 15 mass % to 50 mass % and, further preferably, from 20% mass % to 45 mass % to the polyalkylene naphthalate resin. In a case where they are 1 nm or more, they are easily dispersible to cause less agglomerated particles, whereas the haze is small in a case where they are 400 nm or less, and both of the cases are advantageous for keeping the transparency.

Preferred fine particles include fine inorganic particles such as of silica, alumina, titania, zirconia, mica, talc, calcium carbonate, barium sulfate, zinc oxide, magnesium oxide, calcium sulfate and kaolinite, and fine organic particles such as of crosslinked polystyrene. More preferred, are silica, alumina, titania, zirconia, mica, talc, and calcium carbonate. They may be any of an amorphous, platy, spherical, or acicular shape, or two or more kinds of fine particles may be used in admixture.

The fine particles may be added together with the monomer before polymerization of the polyalkylene naphthalate resin, or may be added after the polymerization of the polyalkylene naphthalate resin. Since the former induces occurrence of increase in the viscosity during polymerization and can not sometimes control the polymerization uniformly, the latter is more preferred because of uniform dispersibility. The fine particles are preferably applied with surface modification in order to improve the wettability with the polyalkylene naphthalate resin. The surface modifier includes coupling agents such as higher fatty acids, higher fatty acid metal salts, higher fatty acid esters, higher fatty acid amides, silicates, titanates, and aluminates.

It is preferred to add the fine particles in the molten state of oligomers for the polyalkylene naphthalate resin before dispersion of the fine particles and coat the surface of the fine particles previously with the polyalkylene naphthalate resin. The intrinsic viscosity of the oligomer is, preferably, from 0.5 to 4, more preferably, from 1 to 3 and, further preferably, from 1 to 2. The ratio (P/O) of the oligomer (O) and the fine particles (P) is, preferably, from 1 to 100, more preferably, from 3 to 50 and, further preferably, from 5 to 20.

The oligomer and the fine particles can be mixed by using a bunbury mixer, a kneader, a roll mill, a single screw or twin screw extruder. The mixing temperature is, preferably, from 100° C. to 350° C., more preferably, from 120° C. to 300° C. and, further preferably, from 150° C. to 250° C. The mixing time is, preferably, from 1 min to 200 min, more preferably, from 2 min to 100 min and, further preferably, from 3 min to 30 min.

Then, they are further kneaded with the polyalkylene naphthalare resin. A bunbury mixer, a kneader, a roll mill, a single screw or a twin screw extruder can be used for the kneading. The mixing temperature is, preferably, from 200° C. to 350° C., more preferably, from 240° C. to 340° C. and, further preferably, from 260° C. to 330° C. The mixing time is, preferably, from 1 min to 200 min, more preferably, from 2 min to 100 min and, further preferably, from 3 min to 30 min.

The polyalkylene naphthalate resin containing such fine particles may be formed into a film as a single layer but it may be used as a laminate film. In the form of the laminate film, the difference of the surface modulus of elasticity between the surface and the rear face can be made as from 0.5 GPa to 10 GPa, more preferably, from 0.8 GPa to 7 GPa and, further preferably, 1.0 GPa to 5 GPa. In a case where the surface hardness is high for both of the surfaces, the retention force with a conveyor roll is lowered tending to cause scratch injuries due to slip during film formation. In such a laminate film, a polyalkylene naphthalate resin layer containing fine particles (layer B) may be laminated on one surface of a polyalkylene naphthalate resin layer with less fine particle content than that in the layer B (B/A), or a polyalkylene naphthalate resin layer (layer B') with less fine particle content than that in the layer B may be laminated to the layer A on the side opposite to the layer B (B/A/B').

The total layer thickness of the polyalkylene naphthalate resin substrate film of the invention is, preferably, from 30 µm to 600 µm, more preferably, from 40 µm to 400 µm and, further preferably, from 60 µm to 200 µm. The thickness for the layer B and the layer B' is, preferably, from 10 µm to 100 µm, more preferably, from 15 µm to 80 µm, and, further preferably, from 20 µm to 50 µm. In this case, the ratio between the grain size (D) of the fine particle and the thickness of the layer B or layer B' (Tb): (D/Tb) is, preferably, from less than $1 \times 10^{-2}$ to $1 \times 10^{-5}$, more preferably, from $5 \times 10^{-2}$ or less to $1 \times 10^{-4}$ further preferably, from $1 \times 10^{-3}$ or less to $1 \times 10^{-4}$.

The polyalkylene naphthalate resin substrate film used in the invention can be prepared as described below.

(1) Drying of Polyalkylene Naphthalate Resin

The polyalkylene naphthalate resin pellets are dried, preferably, at 100° C. to 250° C., more preferably, at 130° C. to 200° C., and preferably, for 5 min to 5 hours or less and, more preferably, 10 min to one hour.

(2) Melt Extrusion

Each of pellets for use in the layer A, layer B, and layer B' was charged in a single screw or multi-screw kneading extruder and melted. In this case, pellets with addition of a desired amount of fine particles may be used from the first, or pellets with previous addition of fine particles at high concentration (master pellets) may be diluted with pellets with no addition of fine particles to control to a desired concentration. The extrusion temperature is, preferably, at 250 to 350° C. and, more preferably, at 260 to 340° C. and they are melted while being stayed, preferably, for 1 min to 30 min and, more preferably, from 3 min to 15 min. Then, it is preferred to previously filter the molten polymer by using a filter. The filter includes a metal mesh, sintered metal mesh, sintered metal, sand, or glass fiber. A preferred filter size is from 1 µm to 30 µm. The molten polyalkylene naphthalate resin is extruded from a T-die. In a case of preparing a laminate film, each of the ingredients is extruded by using a T-die having a laminate structure (multi-manifold die, etc.). The molten resin is solidified on a casting drum at 40° C. to 100° C. to prepare a not-stretched film. In this case, the planarity of the film can be improved preferably by enhancing the adhesion to a casting drum by using, for example, an electrostatic application method or aqueous film forming method (improving the adhesion between the melt and the drum by coating a fluid such as water on casting drum). The film was peeled to form a not-stretched sheet.

(3) MD Stretching

A not-stretched sheet is stretched in the longitudinal direction (MD). A stretching factor is, preferably, from 2.5 times to 4 times and, more preferably, from 3 times to 4 times. The stretching temperature is, preferably, from 70° C. to 160° C., more preferably, from 80° C. to 150° C., and, further preferably, from 80° C. to 140° C. A stretching speed is, preferably, from 10%/sec to 300%/sec, more preferably, from 30%/sec to 250%/sec and, further preferably, from 50%/sec to 200%/sec. Such MD stretching can be conducted by conveying the film between a pair of rolls of different circumferential speeds.

(4) TD Stretching

Generally, the film is stretched in the traverse direction (TD) succeeding to the stretching in the MD direction. The stretching factor is, preferably, from 2.5 times to 5 times, more preferably, from 3 times to 4.5 times and, further preferably, from 3.3 times to 4.3 times. The stretching temperature is, preferably, from 75° C. to 165° C., more preferably, from 80° C. to 160° C. and, further preferably, from 85 to 155° C. The stretching speed is, preferably, from 10%/sec to 300%/sec, more preferably, from 30%/sec to 250%/sec and, further preferably, from 50%/sec to 200%/sec. The TD stretching can be attained by transporting the film in a tenter while chucking both ends of the film to enlarge the width.

(5) Heat Setting Temperature

A heat setting temperature is, preferably, from 190° C. to 275° C., more preferably, from 210° C. to 270° C. and, further preferably, from 230° C. to 270° C. A treating time is, preferably, from 5 sec to 180 sec, more preferably, from 10 sec to 120 sec and, further preferably, from 15 sec to 60 sec. It is preferred to conduct relaxation during heat setting in the traverse direction by from 0% to 10%, more preferably, from 0% to 8% and, further preferably, from 0% to 6%. Such heat setting and relaxation can be attained by conveying the film to a heat setting zone while chucking both ends thereof and narrowing the width.

(6) Take-up

After heat setting, cooling and trimming (cutting for lugs) are conducted and the film is taken-up into a roll. In this case, it is also preferred to apply thickness control (knurling) to film ends. A film forming width is, preferably, from 0.5 m to 10 m, more preferably, from 0.8 m to 8 m and, further preferably, from 1 m to 6 m.

The polyalkylene naphthalate resin constituting the substrate film has a surface modulus of elasticity, preferably, from 5 GPa to 15 GPa, more preferably, from 5.5 GPa to 12 GPa and, further preferably, from 6 GPa to 10 GPa. The surface modulus elasticity is a value determined by using a micro-surface hardness tester. Specific method is as described below.

Using a surface micro-hardness tester (manufactured by Fischer Instruments Co: Fischer scope N100V-HCU), after contacting a Vickers indentor to a sample surface, weight is increased to 1 mN in 10 sec and maintained in this state for 5 sec. The intrusion depth of the Vickers indentor at this instance is defined as $D_{V0}$. Then, when the weight is reduced to 0 mN, the force of turning back the Vickers indentor ($F_V$) and the intrusion depth ($D_V$) are measured and the slanting is defined as a surface modulus of elasticity. That is, expressing $D_V$ on the abscissa and $F_V$ on the ordinate, the absolute value for the slanting for the $D_V$ from $D_{V0}$ to $0.9 \times D_{V0}$ is defined as the surface modulus of elasticity. The measurement was conducted at 25° C. and 60% relative humidity and is expressed as an average value for 10 points.

(Conductive Layer)

Then, in the invention, a conductive layer is provided for preventing static charges. Details are to be described below.

That is, the steam barrier film according to the invention comprises a conductive layer with the resistance of $10^{12} \Omega$ (at 25° C., 60% relative humidity) or less as at least one layer among the layers constituting the film. The resistance value is, preferably, $1 \times 10^{11.5} \Omega$ or less more preferably, $1 \times 10^{10} \Omega$ or less and, particularly preferably, $1 \times 10^{9} \Omega$ or less. In the invention, it is preferred that the resistance does not fluctuate relative to the change of the temperature and the humidity. For example, a layer having the resistance described above for a range from low temperature and low humidity to high temperature and high humidity is preferred. Considering the circumstance in the course of the manufacture or during handling for the circumstantial change in such a case, it is preferred that the conductivity is $10^{12}$ or less even in a wide temperature and humidity range, for example, at a temperature of from −30° C. to 300° C. and at a relative humidity of from 0 to 100%. The resistance for the conductive layer may be determined according to a general surface resistance in a case of measuring that of the conductive layer per se but it is recommended to evaluate from the edge portion in a case of an internal conductive layer. That is, the resistance value can be determined by coating a silver paint on both ends of the conductive layer and measuring the resistance for the conductive layer.

The conductive layer in the invention is preferably a layer containing at least one inorganic conductive material and/or at least one organic conductive material (for example, ionic conductive material). Further it is preferred that the conductive layer contains a conductive metal oxide or conductive polymer. The conductive layer in the invention may also be a transparent conductive film formed by vapor deposition or sputtering.

Examples of preferred metal oxides as the inorganic conductive material are $ZnO$, $TiO_2$, $SnO_2$, $Al_2O_3$, $In_2O_3$, $SiO_2$, $MgO$, $BaO$, $MoO_2$, $V_2O_5$, etc. or composite oxides containing such metal elements and, particularly, ZnO, SnO$_2$, Sb$_2$O$_3$, or V$_2$O$_5$ is preferred. As examples of heteroatoms in the composite oxides, addition of Al, In, Ta, Sb, Nb, Ag, Cl, Br or I is effective and the addition amount is preferably within a range from 0.01 mol % to 25 mol %. As examples of composite oxides containing hetero atoms, it is effective to add, for example, Al, In, etc. to ZnO, Sb, Nb, halogen element, etc. to SnO$_2$, or Nb, Ta, etc. to TiO$_2$. The addition amount of the hetero-atoms is within a range, preferably, from 0.01 mol % to 30 mol % and, particularly preferably, from 0.1 mol % to 10 mol %.

The metal oxides having the conductivity are preferably in the form of a powder and the volumic resistivity of the powder is, preferably, 10$^5$ Ωm or less, more preferably, 10$^3$ Ωm or less and, particularly preferably, 10 Ωm or less. The primary grain size of the powder is, preferably, from 50 Å to 0.2 μm and, particularly preferably, from 50 Å to 0.1 μm. Further, it is preferred that a powder having a specific structure with the major diameter of a higher order structure of the agglomerates within a range from 100 Å to 6 μm (fine conductive particle) is contained by from 0.01% to 80% by volume in the conductive layer. The amount of the fine conductive particle to be used is, preferably, from 0.001 to 5.0 g/m$^2$ and, particularly preferably, from 0.005 to 1 g/m$^2$. The oxides are described, for example, in each of JP-A-56-143431, JP-A-56-120519, and JP-A-58-62647. Furthermore, a conductive material in which the metal oxide described above is deposited to other crystalline metal oxide particles or fibrous products (for example, spherical oxidized carbon black) as described in JP-B-59-6235 may also be used. The grain size that can be utilized for the conductive material is, preferably, 10 μm or less and, in a case where the size is 2 μm or less, stability after dispersion is favorable and easy to use.

Further, it is preferred to utilize conductive particles of 0.5 μm or less for the conductive layer in order to decrease the light scattering property as less as possible. This is because the substrate can be kept transparent even by the provision of the conductive layer. In the specification, "transparent substrate" means a substrate having a light transmittance of 60% or higher, more preferably, a light transmittance of 75% or higher and, particularly preferably, a light transmittance of 85% or higher. In a case where the conductive material is fibrous, it is preferred that the length is 30 μm or less and the diameter is 2 μm or less and, particularly preferably, the length is 25 μm or less, the diameter is 0.5 μm or less, and the length/diameter ratio is 3 or more. Particularly preferred are spherical conductive materials comprising SnO$_2$/Sb$_2$O$_3$ (or /Sb$_2$O$_5$) as the crystalline metal oxide, having the average diameter of from 10 to 50 nm for the primary grain size and of about 0.01 to 0.5 μm as secondary agglomerates. Further, in the invention, a sol-like metal oxide can also be used and, for example, the conductive layer can be formed from a tin oxide sol solution or alumina-sol solution.

Further, the conductive layer in the invention may also contain an ionic conductive substance. The ionic conductive substance means a substance showing electroconductivity and containing ions as electricity carrying support. Examples of the ionic conductive substance include metal oxide sols containing ionic polymer compounds and electrolytes. The ionic polymer compounds include anionic polymer compounds as described in JP-B-49-23828, JP-B-49-23827, and JP-B-47-28937; ionene type polymers having dissociation groups in the main chain as described in JP-B-55-734, JP-A-50-94672, JP-B-59-14735, JP-B-57-18175, JP-B-57-18176, and JP-B-57-56059; and cationic pendant type polymer having cationic dissociation groups in the side chains as described in JP-B-53-13223, JP-B-57-15376, JP-B-53-45231, JP-B-55-145738, JP-B-55-65950, JP-B-55-67746, JP-B-57-11342, JP-B-57-19735, JP-B-58-56858, JP-A-61-27853, and JP-A-62-9346. The ionic polymer compounds may be used each alone or a several kinds of ionic conductivity substances may be used in combination. The ionic polymer compound is used within a range, preferably, from 0.005 g to 2.0 g/cm$^2$ and, particularly preferably, within a range from 0.01 g to 1.0 g/m$^2$.

The electrolytes include, for example, potassium nitrate, sodium chloride, potassium chloride, potassium perchlorate and p-toluene sulfonic acid. The content of the electrolyte is, preferably, 0.0001 to 1.0 g/m$^2$ and, more preferably, from 0.005 to 0.5 g/m$^2$.

Referring more specifically, preferred conductive polymer compound used in the invention are, for example, polyvinyl benzene sulfonic acid salts, polyvinyl benzyltrimethyl ammonium chloride, quaternary salt polymers as described in U.S. Pat. Nos. 4,108,802, 4,118,231, 4,126,467 and 4,137,217, and polymer latexes as described in U.S. Pat. No. 4,070,189, OLS No. 2,830,767, and JP-A-61-296352 and JP-A-61-62033. Specific examples of the conductive polymer of the invention are to be described below but they are not limitative. Composition of the polymer is represented by polymerization percentage

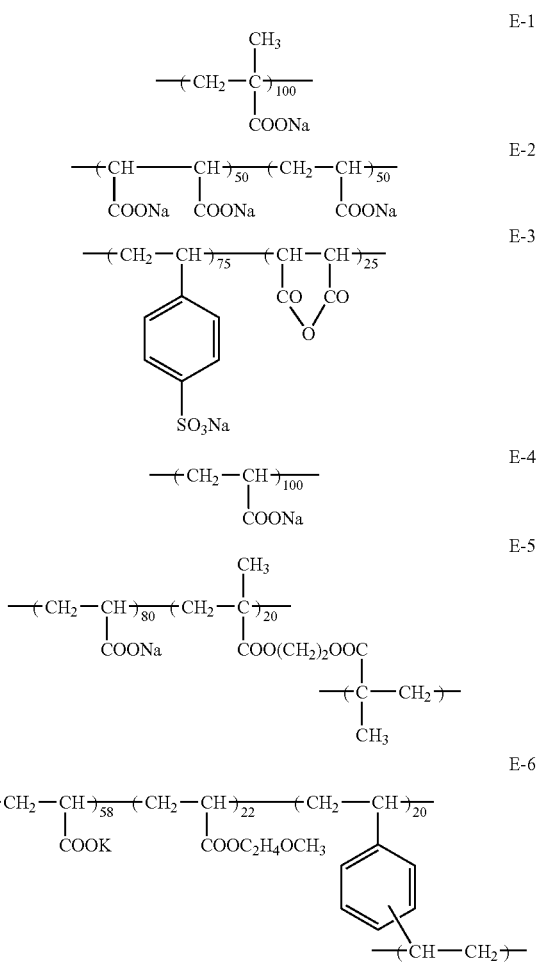

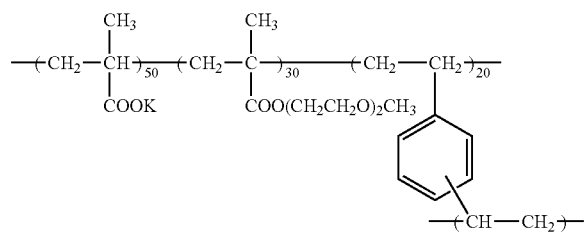

E-7

The conductive inorganic metal material or the organic conductive material used in the invention is used being dispersed or dissolved in a binder. The binder is not particularly limited so long as it has a film forming property and includes, for example, proteins such as gelatin and casein, cellulose compounds such as carboxymethyl cellulose, hydroxy ethyl cellulose, acetyl cellulose, diacetyl cellulose, and triacetyl cellulose, saccharides such as dextran, agar, sodium alginate and starch derivatives, synthetic polymers such as polyvinyl alcohol, polyvinyl acetate, polyacrylate ester, polymethacrylate ester, polystyrene, polyacrylamide, poly-N-vinyl pyrrolidone, polyester, polyvinyl chloride, and polyacrylic acid. Particularly, gelatin (lime-treated gelatin, acid-treated gelatin, enzymatically decomposed gelatin, gelatin phthalide, acetylated gelatin, etc.), acetyl cellulose, doacetyl cellulose, triacetyl cellulose, polyvinyl acetate, polyvinyl alcohol, butyl polyacrylate, polyacryl amide, dextran, SBR, latex, polyvinylidene chloride latex, etc. are preferred.

In order to lower the resistance of the conductive layer by using the conductive inorganic metal material or the organic conductive material used in the invention more effectively, it is preferred that the volumic content of the conductive material in the conductive layer is higher and the binder is necessary at least by about 5% for providing the layer with a sufficient strength. With the view point, the volumic content of the conductive inorganic metal material or the organic conductive material is preferably within a range from 5 to 95%. The amount of the conductive inorganic metal material or the organic conductive material used in the invention is, preferably, from 0.01 to 2 g/m$^2$ and, particularly preferably, from 0.01 to 0.5 g/m$^2$. The conductive layer containing the conductive inorganic metal material or the organic conductive material used in the invention is preferably formed at least by one layer as the constituent layer on the substrate film. The conductive layer may be any of a surface protective layer, a back layer, an undercoat layer, etc., it may be formed optionally by two or more layers.

Further, as the conductive material, organic electroconductive materials are also preferred and they include, for example, polyaniline derivatives, polythiophene derivatives, polypyrrole derivatives, and polyacetylene derivatives. Among them, particularly preferred are polypyrrole and salts thereof with polystyrene sulfonic acid are preferred. Further, it is also preferred to contain at least one of gold or silver colloid. Further, an alloy of silver and palladium is preferred with a view point of weather proofness and the palladium content is preferably from 5 to 30 mass %. The method of preparing silver colloid particles includes a method of preparing fine particles by a usual low vacuum evaporation method and a method of preparing metal colloids of reducing an aqueous solution of a metal salt. The average grain size of the metal particles is preferably from 1 to 200 nm. The conductive layer preferably consists substantially only of fine metal particles and it is preferred not to contain a non-conductive material such as a binder with a view point of conductivity.

The conductive layer located to the steam barrier film of the invention is not particularly limited for the position thereof so long as the conductivity as the functional layer can be ensured and a preferred layer constitution includes the followings. Assuming the side of the hygroscopic layer opposite to the substrate film, that is, the side located with the substrate film as an inner side, an inorganic gas barrier layer, a hygroscopic layer, and an adjacent organic layer may be located at any optional order by one or more layer to the further outside of the inorganic gas barrier layer located to the outside of the hygroscopic layer. Alternatively, various functional layers may also be located to the outside of the inorganic gas barrier layer or the outermost layer located to the outside of the hygroscopic layer respectively and the conductive layer may be located at such position in the invention.

In the invention, examples of the functional layer other than the conductive layer further include optical functional layers such as an anti-reflection layer, a polarization layer, a color filter, a UV-ray absorbing layer and a layer of improving the light take-out efficiency; dynamic function layers such as a hard coat layer or a stress relaxation layer; an anti-clouding layer; an anti-contamination layer, a layer undergoing printing, etc. The functional layers may also be located on the opposite side of the substrate film where the inorganic gas barrier layer, the hygroscopic layer and the adjacent organic layer are located. Further, in the steam barrier film of the invention, an inorganic gas barrier layer, a hygroscopic layer, and an adjacent organic layer, etc. can be located on both surfaces of the substrate film. Further, a gas barrier laminate layer in which at least an inorganic gas barrier layer, an adjacent organic layer, and an inorganic gas barrier layer are laminated in this order can also be located to the hygroscopic layer on the side opposite to the substrate film. The gas barrier laminate layer has a feature capable of preventing intrusion of molecules of water from the opposite surface of the film to suppress the dimensional change of the film substrate thereby preventing stress concentration to or destruction of the gas barrier layer and, as a result, capable of supplying a display of high durability.

<Optical Display Material>

While the application use of the steam barrier film of the invention is not particularly limited, since it is excellent in the both of the optical characteristics and mechanical characteristics, it can be used suitably as an optical display material such as a substrate for use in transparent electrodes of an image display device. "Image display device" referred to herein means a circular polarization plate, a liquid crystal display device, a touch panel, an organic electroluminescence (EL) device, etc.

<Circular Polarization Plate>

The circular polarization plate can be manufactured by laminating a λ/4 plate and a polarization plate on the steam barrier film of the invention. In this case, they are laminated such that the phase delay axis of the λ/4 plate and the absorption axis of the polarization plate form an angle of 45°. A polarization plate stretched in 45° direction relative to the longitudinal direction (MD) is used preferably and, those, for example, disclosed in JP-A-2002-865554 can be used suitably.

<Liquid Crystal Display Device>

A liquid crystal display device is generally classified into a reflection type liquid crystal display device and a transmission type liquid crystal display device.

The reflection type liquid crystal display device has a constitution comprising a lower substrate, a reflection electrode, a lower orientation film, a liquid crystal layer, an upper orientation film, a transparent electrode, an upper substrate, a λ/4 plate, and a polarization film orderly from below. The steam barrier film of the invention can be used as the transparent electrode and the upper substrate. In a case of providing the reflection type liquid crystal display device with a color display function, a color filter layer is preferably situated further between the reflection electrode and the lower orientation film, or between the upper orientation film and the transparent electrode.

Further, the transmission type liquid crystal display device has a constitution comprising a back light, a polarization plate, a λ/4 plate, a lower transparent electrode, a lower orientation film, a liquid crystal layer, an upper orientation film, an upper transparent electrode, an upper substrate, a λ/4 plate, and a polarization film orderly from below. Among them, the steam barrier film of the invention can be used as the upper transparent electrode and the upper substrate. Further, in a case of providing the transmission type liquid crystal display device with the color display function, it is preferred that a color filter layer is preferably situated further between the lower transparent electrode and the lower orientation film, or between the upper orientation film and the transparent electrode.

While the structure of liquid crystal layer is not particularly limited, it is, preferably, for example, a TN (Twisted Nematic) type, an STN (Supper Twisted Nematic) type a HAN (Hybrid Aligned Nematic) type, a VA (Vertically Alignment) type, an ECB (Electrically Controlled Birefringence) type, an OCB (Optically Compensatory Bend) type, or a CPA (Continuous Pinwheel Alignment) type.

<Touch Panel>

As the tough panel, those applying the steam barrier film of the invention to substrates described, for example, in JP-A-5-127822 and JP-A-2002-48913 can be used.

<Organic Electroluminescence Device>

The organic electroluminescence device capable of making the best characteristic of the substrate of the invention is to be described more specifically. A light emitting device of the invention has a cathode and an anode on a substrate and has an organic compound layer containing an organic light emitting layer (hereinafter sometimes simply referred to as "light emitting layer") between both of the electrodes. In view of the property of the light emitting device, at least one of the anode and the cathode is preferably transparent.

As the mode of the lamination of the organic compound layer in the invention, it is preferred such a mode where a hole transporting layer, a light emitting layer, and an electron transporting layer are laminated in this order from the side of the anode. Further, a charge blocking layer or the like may be present between the hole transporting layer and the light emitting layer or between the light emitting layer and the electron transporting layer. A hole injecting layer may be provided between the anode and the hole transporting layer and an electron injecting layer may be provided between the cathode and the electron transporting layer. Each of the layers may be divided into a plurality of secondary layers.

<Anode>

It may usually suffice that the anode has a function as an electrode for supplying holes to the organic compound layer and the shape, structure, size, etc. thereof are not particularly limited and can be selected properly from known electrode materials in accordance with the application use and the purpose of the light emitting device. As described above, the anode is formed usually as a transparent anode.

The material for the anode includes preferably, for example, metals, alloys, metal oxides, conductive compounds or mixtures of them. Specific examples of the anode material include conductive metal oxides such as tin oxide doped with antimony, fluorine, etc. (ATO, FTO), tin oxide, zinc oxide, indium oxide, indium tin oxide (ITO), and zinc indium oxide (IZO), metals such as gold, silver, chromium, and nickel, as well as mixtures or laminates of such metals with conductive metal oxides, inorganic conductive materials such as copper iodide, and copper sulfide, organic conductive materials such as polyaniline, polythiophene and polypyrrole and laminates thereof with ITO. Among them, preferred are conductive metal oxides and, particularly preferably, ITO with a view point of productivity, high conductivity, transparency, etc.

The anode can be formed on the substrate in accordance with a method selected properly, for example, from wet method such as a printing method, and a coating method, physical method such as a vacuum vapor deposition method, a sputtering method, and an ion plating method, and chemical method such as CVD or plasma CVD while considering the adaptability with the material constituting the anode. For example, in a case of selecting ITO as the material for the anode, the anode can be formed in accordance with a DC or RF sputtering method, a vacuum vapor deposition method, an ion plating method, etc.

In the organic electroluminescence device, the position for forming the anode is not particularly limited and can be selected properly in accordance with the application use and the purpose of the light emitting device and it is preferably formed on the substrate. In this case, the anode may be formed entirely or partially on one of the surfaces of the substrate. Patterning upon forming the anode may be conducted by chemical etching adopting photolithography, etc., or by physical etching adopting laser or the like. Further, the patterning may be conducted by vacuum vapor deposition, sputtering, etc. while stacking a mask, or by a lift-off method or a printing method. The thickness of the anode can be selected properly depending on the material constituting the anode and, while it can not be determined generally, it is usually about from 10 nm to 50 µm and, preferably, from 50 nm to 20 nm.

The resistance value of the anode is, preferably, $10^3$ $\Omega/\square$ or less and, more preferably, $10^2$ $\Omega/\square$ or less. In a case where the anode is transparent, it may be colorless transparent or colored transparent. For taking out light emission from the side of the transparent anode, the transmittance is, preferably, 60% or higher and, more preferably, 70% or higher. The transparent anode is described specifically in "New Development of Transparent Electrode Film", supervised by Yutaka Sawada, published from CMC (1999) and the matters described therein can be applied to the invention. In a case of using a plastic substrate of low heat resistance, a transparent anode using ITO or IZO and forming a film at a low temperature of 150° C. or lower is preferred.

<Cathode>

It may usually suffice that the cathode has a function as an electrode for injecting electrons to the organic compound layer and the shape, structure, size etc. thereof are not particularly limited and can be selected properly from known electrode materials in accordance with the application use and the purpose of the light emitting device. The material constituting the cathode includes, for example, metals, alloys, metal oxides, electroconductive compounds, and mixtures thereof. Specific examples include alkali metals (for example, Li, Na, K, and Cs), group II metals (for example, Mg and Ca), gold, silver, lead, aluminum, sodium-potassium alloy, lithium-aluminum alloy, magnesium-silver alloy, indium, and rare earth metals such as ytterbium. They may be used alone or two or more of them can be preferably used in combination with a view point of making the stability and the electron injecting property compatible.

Among them, as the material constituting the cathode, alkali metals or group II metals are preferred in view of the electron injecting property and materials mainly comprising aluminum are preferred with a view point of excellent storage stability.

Materials mainly comprising aluminum mean aluminum per se, an alloy of aluminum and from 0.01 to 10 mass % of an alkali metal or group II metal, or a mixture thereof (for example, lithium-aluminum alloy, and magnesium-aluminum alloy). The materials for the cathode are described specifically in JP-A-2-15595 and JP-A-5-121172 and the materials described in the publications can be applied also to the invention.

The method of forming the cathode is not particularly limited and it can be conducted in accordance with known methods. For example, the cathode can be formed in accordance with a method selected properly from wetting method such as a printing method and a coating method, physical method such as a vacuum vapor deposition method, a sputtering method or, an ion plating method, and chemical method such as a CVD or plasma CVD method while considering the adaptability with the material constituting the cathode. For example, in a case of selecting metals or the like as a material for the cathode, it can be formed in accordance with a sputtering method, etc. by sputtering one of them or plurality of them simultaneously or successively. Patterning upon forming the cathode may be conducted by chemical etching such as photolithography, or physical etching such as by laser, or it may be conducted by vacuum vapor deposition, sputtering or the like while stacking a mask or by a lift off method or a printing method.

In the invention, the position for forming the cathode is not particularly limited and it may be formed entirely or partially on the organic compound layer. Further, a dielectric layer of a fluoride or oxide of an alkali metal or a group II metal, etc. may be inserted at a thickness of from 0.1 to 5 nm between the cathode and the organic compound layer. The dielectric layer can be regarded as a sort of an electron injecting layer. The dielectric layer can be formed, for example, by a vacuum vapor deposition method, a sputtering method or an ion plating method. The thickness of the cathode can be selected properly depending on the material constituting the cathode and, while it can not be defined generally, it is usually about from 10 nm to 5 µm and, preferably, from 50 nm to 1 µm.

The cathode may be transparent or not transparent. The transparent cathode can be formed by forming a thin film of the material of the cathode to a thickness of from 1 to 10 nm and, further, laminating a transparent conductive material such as ITO or IZO.

<Organic Compound Layer>

The organic compound layer in the invention is to be described.

The organic electroluminescence device of the invention has at least one organic compound layer containing at least a light emitting layer. Other organic compound layers than the organic light emitting layer include layers such as a hole transporting layer, an electron transporting layer, a charge blocking layer, a hole injecting layer, and electron injecting layer respectively as described above.

(Formation of Organic Compound Layer)

In the organic electroluminescence device of the invention, each of the layers constituting the organic compound layer can be formed suitably by any of a dry film forming method such as a vapor deposition method or a sputtering method, a transfer method, a printing method, etc.

(Organic Light Emitting Layer)

The organic light emitting layer is a layer having a function of accepting holes from the anode, the hole injecting layer, or the hole transporting layer and accepting electrons from the cathode, the electron injecting layer, or the electron transporting layer upon application of an electric field, providing a site for re-combination of hole and electron to emit light. The light emitting layer in the invention may be constituted only of a light emitting material, or have a constitution comprising a mixed layer of a host material and a light emitting material. The light emitting material may be a fluorescence emitting material or a phosphorescence emitting material, and a dopant may comprise one or more species. The host material is preferably a charge transporting material. The host material may comprise one or more species and includes, for example, a constitution of mixing an electron transporting host material and a hole transporting host material. Further, it may also contain a material not having charge transportability and not emitting light in the light emitting layer. Further, the light emitting layer may have one or more layer and each of the layers may emit light at different emission colors.

Examples of the fluorescence emitting material usable in the invention include, for example, various metal complexes typically represented by metal complexes of benzoxazole derivatives, imidazole derivatives, benzothiazole derivatives, styrylbenzene derivatives, polyphenyl derivatives, diphenyl butadiene derivatives, tetraphenyl butadiene derivatives, naphthalimide derivatives, cumarine derivatives, condensed aromatic compound, perynone derivatives, oxadiazole derivatives, oxazine derivatives, aldazine derivatives, pyralidine derivatives, cyclopentadiene derivatives, bisstyryl anthracene derivatives, quinacridone derivatives, pyrrolopyridine derivatives, thiadiazolopyridine derivatives, cyclopentadiene derivatives, styrylamine derivatives, diketopyrrolopyrole derivatives, aromatic dimethylidene compound, and 8-quinolinole derivatives, and metal complexes of pyrrometene derivatives, polymer compounds such as polythiophene, polyphenylene and polyphenylene vinylene, and compounds such as organic silane derivatives.

Further, the phosphorescence emitting materials usable in the invention includes, for example, complexes containing transition metal atoms or lanthanoide atoms. The transition metal atoms are not particularly limited and include, preferably, ruthenium, rhodium, palladium, tungsten, rhenium, osmium, iridium, and platinum and, more preferably, rhenium, iridium and platinum. The lanthanoide atoms include lanthanum, cerium, praseodymium, neodymium, samarium, europium, gadolinium, terbium, dysprosium, holmium, erbium, thulium, ytterbium, and lutetium. Among the lanthanoide atoms, neodymium, europium, and gadolinium are preferred.

Ligands of complexes include those ligands, described, for example, in "Comprehensive Coordination Chemistry", written by G. Wilkinson, et al., published from Pergamon Press in 1987, "Photochemistry and Photophysics of Coordination Compounds" written by H. Yersin, published from Springer-Verlag Co. in 1987, and "Organic Metal Chemistry—Foundation and Application—" written by Akio Yamamoto, published from Shokabo Co. in 1982, etc. Specific ligands are, preferably, halogen ligands (preferably, chlorine ligand), nitrogen-containing heterocyclic ligands (for example, phenylpyridine, benzoquinoline, quinolinol, bipyridyl, and phenanthroline), diketone ligands (for example, acetylacetone), carboxylic acid ligands (for example, acetic acid ligand), carbon monoxide ligand, isonitrile ligand, and cyano ligand and, more preferably, nitrogen-containing heterocyclic ligands. The complexes described above may have one transition metal atom in the compound or may be a so-called composite nuclei complexes having two or more of them. Metal atoms of different kinds may be contained together.

The phosphorescence emitting material is contained in the light emitting layer by, preferably, from 0.1 to 40 mass % and, more preferably, from 0.5 to 20 mass %. Further, the host materials contained in the light emitting layer in the invention include, for example, those having carbazole skeleton, having diarylamine skeleton, having pyridine skeleton, having pyrazine skeleton, having triazine skeleton, and having arylsilane skeleton, or those materials exemplified in the columns for the hole injecting layer, the hole transporting layer, the electron injecting layer and the electron transporting layer to be described later. The thickness of the light emitting layer is not particularly limited and usually it is, preferably, from 1 nm to 500 nm, more preferably, from 5 nm to 200 nm and, further preferably, from 10 nm to 100 nm.

(Hole Injecting Layer, Hole Transporting Layer)

The hole injecting layer and the hole transporting layer are layers having a function of accepting holes from the anode or from the side of the anode and transporting them to the side of the cathode. The hole injecting layer and the hole transporting layer are preferably layers containing specifically, for example, carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stylbene derivatives, silazene derivatives, aromatic tertiary amine compounds, styrylamine compounds, aromatic dimethylidine compounds, porphiline derivatives, organic silane derivatives, and carbon. The thickness of the hole injecting layer and the hole transporting layer is preferably each 500 nm or less with a view point of lowering the driving voltage.

The thickness of the hole transporting layer is, preferably, from 1 nm to 500 nm, more preferably, from 5 nm to 200 nm and, further preferably, from 10 nm to 100 nm. Further, the thickness of the hole injecting layer is, preferably, from 0.1 nm to 200 nm, more preferably, from 0.5 nm to 100 nm and, further preferably, from 1 nm to 100 nm. The hole injecting layer and the hole transporting layer may be of a single layered structure comprising one or more of the materials described above or may be of a multi-layered structure comprising plural layers of an identical composition or different kinds of compositions.

(Electron Injecting Layer, Electron Transporting Layer)

The electron injecting layer and the electron transporting layer are layers having a function of accepting electron from the cathode or from the side of the cathode and transporting them to the side of the anode. The electron injecting layer and the electron transporting layer are preferably layers containing, specifically, various kinds of metal complexes typically represented by metal complexes of triazole derivatives, oxazole derivatives, oxodiazole derivatives, imidazole derivatives, fluorenone derivatives, anthraquinodimethane derivatives, anthron derivatives, diphenylquinone derivatives, thiopyrane dioxide derivatives, carbodiimide derivatives, fluorenylidene methane derivatives, distyrylpyradine derivatives, aromatic ring tetracarboxylic acid anhydrides such as naphthalene and perylene, phthalocyanine derivatives, and 8-quinolinole derivatives, and metal complex having metal phthalocyanine, benzoxazole, or benzothiazole as the ligand, and organic silane derivatives.

The thickness of the electron injecting layer and the electron transporting layer is preferably from 50 nm or less respectively with a view point of lowering the driving voltage. The thickness of the electron transporting layer is, preferably, from 1 nm to 500 nm, more preferably, from 5 nm to 200 nm and, further preferably, from 10 nm to 100 nm. Further, the thickness of the electron injecting layer is, preferably, from 0.1 nm to 200 nm, more preferably, from 0.2 nm to 100 nm and, further preferably, from 0.5 nm to 50 nm. The electron injecting layer and the electron transporting layer may be of a single layered structure comprising one or more of the materials described above or a multi-layered structure comprising plural layers each of an identical composition or different kinds of compositions.

(Hole Blocking Layer)

The hole blocking layer is a layer having a function of preventing holes transported from the anode to the light emitting layer from passing through to the side of the cathode. In the invention, the hole blocking layer can be provided as an organic compound layer adjacent with the light emitting layer on the side of the cathode. Examples of the organic compound constituting the hole blocking layer include aluminum complexes such as $BAl_q$, triazole derivatives, and phenanthroline derivatives such as BCP. The thickness of the hole blocking layer is, preferably, from 1 nm to 500 nm, more preferably, 5 nm to 200 nm and, further preferably, from 10 nm to 100 nm. The hole blocking layer may be of a single layered structure comprising one or more kinds of the materials described above or a multi-layered structure comprising plural layers each of an identical composition or different kinds of compositions.

(Protective Layer)

In the invention, the entire organic EL device may be protected by a protective layer.

The material contained in the protective layer may be any material of suppressing intrusion of moisture or oxygen, or the like into the device that promotes deterioration of the device. Specific examples include metals such as In, Sn, Pb, Au, Cu, Ag, Al, Ti, and Ni, metal oxides such as MgO, SiO, $SiO_2$, $Al_2O_3$, GeO, NiO, CaO, BaO, $Fe_2O_3$, $Y_2O_3$, and $TiO_2$, metal nitrides such as $SiN_x$, $SiN_xO_y$, metal fluorides such as $MgF_2$, LiF, $AlF_3$, and $CaF_2$, polyethylene, polypropylene, polymethyl methacrylate, polyimide, polyurea, polytetrafluoroethylene, polychlorotrifluoroethylene, polydichlorodifluoroethylene, copolymers of chlorotrifluoroethylene and dichlorofluouroethylene, a copolymer obtained by copolymerizing tetrafluoroethylene and a monomer mixture containing at least one comonomer, fluoro-containing copolymer having cyclic structures in the copolymerization main chain, water absorbing material with a water absorptivity of 1% or more, and moisture proofing material with a water absorptivity of 0.1% or less.

The method forming the protective layer is not particularly limited and, for example, a vacuum vapor deposition method, a sputtering method, a reactive sputtering method, an MBE (Molecular Beam Epitaxy) method, a cluster ion beam method, an ion plating method, a plasma polymerization method (RF-excited ion plating method), a plasma CVD method, a laser CVD method, a thermal CVD method, a gas source CVD method, a coating method, printing method or a transfer method can be applied. In the invention, the protective layer may also be used as a conductive layer.

(Sealing)

Further, the organic electrolumiscence device of the invention may be sealed for the entire device by using a sealing vessel. Further, a water absorbent or an inert liquid may be sealed in a space between the sealing vessel and the light emitting device. The water absorbent is not particularly limited and includes, for example, barium oxide, sodium oxide, potassium oxide, calcium oxide, sodium sulfate, calcium sulfate, magnesium sulfate, phosphorous pentoxide, calcium chloride, magnesium chloride, copper chloride, cesium fluoride, niobium fluoride, calcium bromide, vanadium bromide, molecular sieve, zeolite, and magnesium oxide. The inert liquid is not particularly limited and includes, for example, paraffins, liquid paraffins, fluorosolvents such as perfluoro alkanes or perfluoro amines and perfluoro ethers, chloro-solvent, and silicone oils.

Light emission can be obtained from the organic electrolumiscence device of the invention by applying a DC (may optionally containing AC component) voltage (usually from 2 to 15 V), or a DC current between the anode and the cathode. For the driving method of the organic electrolumiscence device of the invention, a driving method described in each of the publications of JP-A-2-148867, JP-A-6-301355, JP-A-5-29080, JP-A-7-13455, JP-A-8-234685 and JP-A-8-241047, and in each of the specifications of Japanese Patent No. 2784615, and U.S. Pat. Nos. 5,828,429 and 6,023,308 can be applied.

(Modification of Polyalkylene Naphthalate Resin Substrate Film)

The steam barrier film of the invention can be further provided with various functions by applying a treatment or fabrication to the polyalkylene naphthalate resin substrate film. Preferred embodiments are described below. At first, a method of surface treatment on a polyalkylene naphthalate resin substrate film is to be described.

By applying the surface treatment to the polyalkylene naphthalate resin substrate film, improvement can be attained for the adhesion between the polyalkylene naphthalene resin substrate film and each of the function layers (for example, undercoating layer and back layer). For example, a glow discharging treatment, a UV-ray irradiation treatment, a corona treatment, a flame treatment or an acid or alkali-treatment can be used. The glow discharge treatment also means a so-called low temperature plasma occurring in a low pressure gas at $10^{-3}$ to 20 Torr but it may be also a glow discharge treatment under an atmospheric pressure.

At first, the glow discharge treatment under a low pressure is described in each of the specifications of U.S. Pat. Nos. 3,462,335, 3,761,299, and 4,072,769 and BP No. 891469. Further, it has also been practiced to introduce a specified gas such as inert gases, nitrogen oxides, organic compound gases, etc. The glow discharge treatment on the surface of the film may be conducted under an atmospheric pressure or under a reduced pressure. This may also be conducted while introducing various gases such as oxygen, nitrogen, helium or argon, or water to the atmosphere for the glow discharge treatment. The vacuum degree during the glow discharge treatment is, preferably, from 0.005 to 20 Torr, more preferably, from 0.02 to 2 Torr. Further, the voltage is, preferably, from 500 to 5,000 V and, more preferably, from 500 to 3,000 V. The discharging frequency used is from DC to several thousands MHz, more preferably, from 50 Hz to 20 MHz and, further preferably, from 1 KHz to 1 MHz. The intensity of the discharging treatment is, preferably, from 0.01 KV·A·min/m$^2$ to 5 KV·A·min/m$^2$ and, more preferably, from 0.15 KV·A·min/m$^2$ to 1 KV·A·min/m$^2$.

Then, also the UV-ray irradiation method is preferably used in the invention. A vacuum lamp used is a high pressure mercury lamp comprising a quartz tube, and the wavelength of UV-rays is preferably between 180 and 380 nm. For the method of UV-ray irradiation, a high pressure mercury lamp having a main wavelength at 365 nm can be used as the light source so long as increase of the surface temperature of the polyalkylene naphthalate resin substrate film to about 150° C. gives no problem in view of the performance of the support. In a case where the low temperature treatment is necessary, a low pressure mercury lamp having a main wavelength at 254 nm is preferred. Further, an ozone-less type high pressure mercury lamps, and a low pressure mercury lamp can also be used. For the amount of the processing light, while the adhesion between the polyalkylene naphthalate resin substrate film and a layer to be adhered is improved as the amount of the processing light is larger, this results in a problem of coloring the support and making the support fragile as the amount of light increases. Accordingly, for the high pressure mercury lamp having the main wavelength at 365 nm, the amount of irradiation light is, preferably, from 20 to 10,000 (mJ/cm$^2$) and, more preferably, from 50 to 2,000 (mJ/cm$^2$). For the low pressure mercury lamp having the main wavelength at 254 nm, the amount of irradiation light is, preferably, from 100 to 10,000 (mJ/cm$^2$) and, more preferably, from 300 to 1500 (mJ/cm$^2$).

Then, as the surface treatment on the polyalkylene naphthalate resin substrate film, the corona discharge treatment is also preferred and, as the corona discharge treatment apparatus, a solid state corona treating apparatus, an LEPEL type surface treating apparatus, a VETAPHON type treating apparatus, etc. manufactured by Pillar Co. can be used. The treatment can be conducted in air under the normal pressure. The discharging frequency during the treatment is from 5 to 40 KV and, more preferably, 10 to 30 KV, and the waveform is preferably an AC sinusoidal wave. A gap clearance between an electrode and a dielectric roll is from 0.1 to 10 mm and, more preferably, from 1.0 to 2.0 mm. The discharging treatment is conducted above the dielectric support roller located in a discharging region and the amount of treatment is from 0.3 to 0.4 KV·A·min/m$^2$ and, more preferably, from 0.34 to 0.38 KV·A·min/m$^2$.

Then, referring to the flame treatment, the gas used may be any of natural gas, liquefied propane gas or city gas and the mixing ratio with air is important. A preferred natural gas/air mixing ratio is from 1/6 to 1/10, preferably, from 1/7 to 1/9 by volume ratio. Further, in a case of liquefied propane gas/air, it is from 1/14 to 1/22 and, preferably, from 1/16 to 1/19. In a case of city gas/air, it is from 1/2 to 1/8 and, preferably, from 1/3 to 1/7. Further, the treatment is desirably conducted with the amount of flame treatment from 1 to 50 Kcal/m$^2$ and, more preferably, from 3 to 20 Kcal/m$^2$.

The surface energy of the solid obtained by the methods described above can be determined in accordance with a contact angle method, a wet heat method and an adsorption method as described in "Foundation and Application of Wetting" (published from Realized Co. In 1989, 12. 10) and the use of the contact angle method is preferred at an angle of contact with water of from 10 to 50°, preferably, from 10 to 40° and, particularly preferably, from 10 to 30°.

Adhesion of the polyalkylene naphthalene resin substrate film and the functional layer includes a method of applying a surface activation treatment and then coating the functional layer directly on the polyalkylene naphthalene resin substitute film thereby obtaining adhesion, and a method of providing an undercoat layer (adhesion layer) after applying a surface treatment to some extent or without such surface treatment and coating thereon the functional layer. Various devices have been adopted also for the constitution of the undercoat layer and include a so-called double layer method of providing a layer well adhering to a support as a first layer (hereinafter simply referred to as a first undercoat layer) and coating thereon a second undercoat layer well adhering to the functional layer as the second layer.

In the single layer method, favorable adhesion is often attained by swelling the polyalkylene naphthalate resin substrate film and mixing the same at the boundary with the undercoat layer material. The undercoat polymer used in the invention includes, for example, a water soluble polymer, a latex polymer, and a water soluble polyester. The water soluble polymer includes, gelatin, gelatin derivatives, casein, agar, sodium alginate, starch, polyvinyl alcohol, a polyacrylic acid copolymer, and a maleic acid anhydride copolymer. The latex polymer includes a vinyl chloride-containing copolymer, a vinylidene chloride containing copolymer, an acrylate ester-containing copolymer, a vinyl acetate-containing copolymer, and a butadiene-containing copolymer. The first undercoat layer in the double layer method includes, for example, copolymers using, as a starting material, monomers selected from vinyl chloride, vinylidene chloride, butadiene, methacrylic acid, acrylic acid, itaconic acid, and maleic acid anhydride, as well as oligomers or polymers such as polyethylene imine, epoxy resin, grafted gelatin, and nitrocellulose.

Further, preferred embodiments of the polyalkylene naphthalate resin substrate film of the invention include those in which a hydrophilic binder layer is provided for adhesion with a polarizer. For example, they include vinyl acetate-maleic acid copolymer compound containing —COOM groups, or hydrophilic cellulose derivatives (for example, methyl cellulose, carboxymethyl cellulose, and hydroxyl cellulose), polyvinyl alcohol derivative (for example, vinyl acetate-vinyl alcohol copolymer, polyvinyl acetal, polyvinyl formal, and polyvinyl benzal), natural polymer compound (for example, gelatin, casein, gum arabic), and hydrophilic group-containing polyester derivatives (for example, sulfonic group-containing polyester copolymer).

The undercoat layer which is applied depending on the case to the polyalkylene naphthalate resin substrate film of the invention can be incorporated with organic or inorganic fine particles as a matting agent to such an extent as not substantially impair the transparency of the functional layer. The matting agent of fine inorganic particles include silica, (SiO$_2$), titanium dioxide (TiO$_2$), calcium carbonate, and magnesium carbonate. As the matting agent of fine organic particles, polymethyl methacrylate, cellulose acetate propionate, polystyrene, those soluble to the treating solution as described in the specification of U.S. Pat. No. 4,142,894, a polymer described in the specification of U.S. Pat. No. 4,396,706 and the like can also be used. The average grain size of the fine particle matting agent is, preferably, from 0.01 to 10 µm and, more preferably, from 0.05 to 5 µm, and the content thereof is, preferably, from 0.5 to 600 mg/m$^2$ and, more preferably, from 1 to 400 mg/m$^2$. The undercoating solution can be coated by well-known coating methods, for example, by a dip coating method, an air knife coating method, a curtain coating method, a roller coating method, a wire bar coating method, a gravure coating method, a slide coating method, or by an extrusion coating method using a hopper described in the specification of U.S. Pat. No. 2,681,294.

EXAMPLE

The present invention will be further specifically explained with reference to the following examples of the present invention. The materials, amounts, ratios, types and procedures of treatments and so forth shown in the following examples can be suitably changed unless such changes depart from the gist of the present invention. Accordingly, the scope of the present invention should not be construed as limited to the following specific examples.

Example 1

Barrier films (Sample 1-1 to Sample 1-8) each having an inorganic gas barrier layer, an adjacent organic layer, a hygroscopic layer and a conductive layer disposed on a substrate film were prepared in accordance with the following procedures. The coating amount of the metal oxides is different between each of the barrier films as shown in Table 1.

(1) Preparation of Substrate Film (1-1) Melt-preparation of Substrate Film

After reacting 100 parts of dimethyl 2,6-naphthalene dicarboxylate and 54 parts of ethylene glycol by ester exchange using 0.045 parts of manganese acetate tetrahydrate as a catalyst, 0.065 parts of trimethyl phosphate and 0.03 parts of antimony trioxide were added. Then, pressure of the system was gradually decreased at 30° C. to 107 Pa. Then, polycondensating reaction was proceeded till the system reached a melt viscosity corresponding to 2000 poise in view of the shaft torque of a stirrer. Thus, a polyethylene naphthalate resin at a limiting viscosity of 0.46 and with a glass transition temperature of 116° C. was obtained. Then, after drying the obtained polyethylene naphthalate resin at 180° C. for 6 hours, it was melt-extruded at 305° C., cooled, and solidified on a casting drum to obtain a sheet. Successively, after stretching the obtained sheet by 3.2 times in the longitudinal direction at 127° C. and then stretching by 3.4 times in the transverse direction at 130° C., the sheet was heat set at 210° C. to prepare a biaxially stretched polyethylene naphthalate film of 100 µm thickness. The biaxially stretched film was heat-treated at 110° C. for 32 hours to manufacture a polyester resin film for use in a steam barrier film.

(1-2) Post Treatment, Winding

Knurling was applied to both ends of the obtained film. Edge cutting was conducted by applying a laser light so as not to result in edge dusts. The knurling was provided by applying embossing from one side. The knurling width was 10 mm and a pressing pressure was set such that the maximum height was larger by 12 µm in average than the average thickness.

The width of the obtained film (100 µm thickness) was 1475 mm. The diameter of the winding core was 169 mm and the tension pattern was set such that the tension at the beginning of winding was 360 N/width and at the end of winding was 250 N/width. The entire winding length was 3000 m. The pressing pressure of the press roll to the winding roll was set to 50 N/width. During winding, the temperature of the film was at 25° C. and water content was 0.01 mass % or less. Further, slack in the winding and creasing were not observed and deviation in the winding was not caused. The appearance of the roll was also satisfactory. The substrate film Sample-1 of the invention was prepared by way of the steps described above.

The substrate film Sample-1 of the invention had a haze of 0.01%, a density of 1.36 g/cm$^3$, a tensile strength of 249 MPa, an elongation rate of 89%, a moisture permeability (g/m$^2$/24 hr) of 1.5, a water absorptivity of 0.1%, a volumic resistivity of $10^{17}$ Ω·cm, a dielectric constant of 3.1, a glass transition temperature (Tg) of 119° C., and a brittling temperature of 267° C. Further, it had a creaking value of 0.45 (static friction of coefficient) and a creaking value of 0.41 (dynamic friction coefficient) and a curl value under 25% RH of −0.1 and 0 in a wet state. A lint as obstacles was less than 3 N/m. Further, it showed bright spots for 0.02 mm to 0.05 mm by the number of less than 5 N/3 m, for 0.05 to 0.1 mm by the number of less than 3 N/3 m and no brightness spots for 0.1 mm or more. They had excellent characteristic for the optical application use. Further, it was excellent film with no adhesion after film formation.

(2) Formation of Steam Barrier Film (2-1) Formation of Inorganic Gas Barrier Layer An inorganic gas barrier layer was formed on a substrate film Sample-1 of the invention using a roll-to-roll system sputtering apparatus (1) shown in FIG. 1. As shown in FIG. 1, the sputtering apparatus (1) has a vacuum vessel (2), in which a drum (3) is located at a central portion thereof for cooling a plastic film (6) by contact at the surface. A delivery roll (4) and a take-up roll (5) for winding the plastic film (6) are arranged in the vacuum vessel (2). The plastic film (6) wound around the delivery roll (4) is wound by way of a guide roll (7) to the drum (3) and, further, the plastic film (6) is wound by way of the guide roll (8) to a take-up roll (5).

In a vacuum exhaustion system, the inside of the vacuum vessel (2) is always exhausted by a vacuum pump (10) from exhaust ports (9). In the film forming system, a target (not illustrated) is loaded on a cathode (12) connected with a DC-system discharge power supply (11) capable of applying a pulsative electric power. The discharge power source (11) is connected to a controller (13) and, further, the controller (13) is connected with a gas flow rate control unit (14) for supplying a reaction gas by way of a pipeline (15) while controlling the introduction amount of the gas. Further, a discharge gas is supplied at a constant flow rate to the vacuum vessel (2) (not illustrated).

Specific conditions during formation of the inorganic gas barrier layer are shown below.

Si was set as a target, and a pulse application system DC power source was provided as the discharging power source (11). Further, a substrate film of 100 µm thickness (substrate film prepared by the method described above) was prepared as the plastic film (6), which was put on the delivery roll (4) and passed as far as the take-up roll (5). After completing the preparation of the substrate to the sputtering apparatus (1), a door for the vacuum vessel (2) was closed and the vacuum pump (10) was actuated and evacuation and drum cooling were started. When the pressure reached $4 \times 10^{-4}$ Pa and the drum temperature was cooled to 5° C., running of the plastic film (6) was started.

Argon was introduced as the discharge gas and the discharging power source (11) was turned-ON to generate plasmas above the Si target with a discharging power of 5 kW and a film-forming pressure of 0.3 Pa and pre-sputtering was conducted for 3 min. Subsequently, oxygen was introduced as a reaction gas and the amount of argon and the oxygen gas was gradually decreased to lower the film-forming pressure to 0.1 Pa after the discharging was stabilized. After confirming the stability of discharging at 0.1 Pa, formation of silicon oxide film was conducted for a predetermined time. After completing the film formation, inside of the vacuum vessel (2) was returned to an atmospheric pressure and a film on which silicon oxide (inorganic gas barrier layer) was deposited was formed and the film was taken-out. The thickness of the inorganic gas barrier layer was about 50 nm.

(2-2) Formation of Adjacent Organic Layer

An acrylic monomer mixture of 50.75 parts by volume of tetraethylene glycol diacrylate, 14.5 parts by volume of tripropylene glycol monoacrulate, 7.25 parts by volume of caprolacton acrylate, 10.15 parts by volume of acrylic acid, and 10.15 parts by volume of "EZACURE" (photopolymerization initiator of benzophenone mixture manufactured by Sartomer Co.) was mixed with 0.03625 mass parts of N,N'-bis(3-methylphenyl)-N,N'-diphenylbenzidine particles as a solid matter, and stirred for about one hour by a supersonic tissue mincer at 20 kHz. They were heated to about 45° C. and the mixture stirred for preventing settling was sent by a pump through a capillary of 2.0 mm inner diameter and 61 mm length to a 1.3 mm spray nozzle. Then, it was sprayed as fine droplets by a supersonic sprayer at 25 kHz and dropped to the surface of the inorganic gas barrier layer or a hygroscopic layer maintained at about 340° C. Then, after cryogenically condensing steams on the inorganic gas barrier layer or the hygroscopic layer of the substrate film in contact with a low temperature drum at a drum surface temperature of about 13° C., it was UV-cured by a high pressure mercury lamp (accumulated amount of irradiation: about 2000 mJ/cm$^2$) to form an organic layer. The film thickness was about 500 nm.

(2-3) Formation of Hygroscopic Layer

To the surface of the laminate formed by applying the inorganic gas barrier layer, the adjacent organic layer applied thereon and, further, the inorganic gas barrier layer (2-1) and, further, the adjacent organic layer in this order, an Ar gas was introduced while using a target of strontium peroxide, calcium peroxide, and a barium peroxide (manufactured by Toyoshima Seisakusho Co.), and sputtered at a discharging power of 100 W and under a film formation pressure of 0.8 Pa for 3 min and then a film was formed as it was to provide a hygroscopic layer. The thickness of the hygroscopic layer was about 20 nm and, as a result of elemental analysis, the ratio between Sr and O, the ratio between Ca and O, and the ratio Ba and O was each at about 1:1.

(2-4) Formation of Laminate Layer

A gas barrier laminate layer comprising three layers of an inorganic gas barrier layer, an adjacent organic layer and an inorganic barrier layer was formed by the method described in (2-1) and (2-2) above to the substrate film on the side opposite to the hygroscopic layer.

(2-5) Formation of Conductive Layer

In the sample obtained in (2-4), a conductive layer comprising the following tin oxide-antimony oxide composite compound was formed on the hygroscopic layer prepared in (2-3) above, various kinds of samples of different conductivity were prepared by changing the addition amount of the conductive material.

Spherical tin oxide-antimony oxide composite compound with an average primary grain size of 15 nm (antimony oxide content: 10 mol %, specific resistivity: 5 Ω·cm, acetone dispersion of finely particulate powder (secondary agglomerate grain size: about 60 nm))
coating amount of solid content described in Table 1

| | |
|---|---|
| Triacetyl cellulose (acetylation degree: 2.60, polymerization degree: 305) | 0.05 g/m² |
| Poly(polymerization degree: 10) oxyethylene-stearyl ether | 0.001 g/m² |

The conductive solution was prepared such that triacetyl cellulose was 5% by volume in acetone and coated by an appropriate bar coater so as to be a desired coating amount and formed so as to be a coating amount of tin oxide-antimony oxide composite compound in Table 1.

(2-6) Evaluation for Physical Property of Barrier Film

Steam permeability of film samples obtained in (2-5) was measured at 40° C.·90% RH by using "PERMATRAN-W3/31" manufactured by MOCON Co. Further, the light permeability of the film samples obtained in (2-5) was measured at 25° C.

60% RH by photospectrometer "UV3100PC" manufactured by a Shimazu Seisakusho Co. As a result, the steam permeability was 0.005 g/m²·day or less and the light permeability was 87.8% and it was confirmed that both of them were excellent characteristics.

(3) Manufacture of Organic EL Device

Each of the barrier films described above was introduced in a vacuum chamber and a transparent electrode comprising a thin IZO film of 0.2 μm-thickness was formed by DC magnetron sputtering using an IZO target (manufactured by Idemitsu Kosan Co.). An aluminum lead wire was connected from the transparent electrode (IZO) to form a laminate structure. After spin-coating an aqueous dispersion of polyethylene oxythiphene.polyethylene sulfonic acid (Baytron P manufactured by BAYER Co.: solid content: 1.3 mass %) to the surface of the transparent electrode, it was dried in vacuum at 150° C. for 2 hours to form a thin hole transporting organic layer of 100 nm thickness. This is referred to as a substrate X.

On the other hand, a coating solution for use in a thin light emitting organic layer having the following composition was coated on one surface of a provisional support comprising polyether sulfone of 188 μm (Sumilite FS-1300 manufactured by Sumitomo Bakelite Co.) by using a spin coater and dried at a room temperature to form a thin light emitting organic layer of 13 nm thickness on the provisional support. This is referred to as transfer material Y.

[Composition]

| | |
|---|---|
| Polyvinyl carbazole (MW = 63000, manufactured by Aldorich Co.) | 40 mass parts |
| Tris(2-phenylpyridine) iridium complex | 1 mass part |

-continued

| | |
|---|---|
| (orthometallized complex) (manufactured by Chemipro Kasei Co.) | |
| Dichloroethane | 3200 mass parts |

The thin light emitting organic film layer as the transfer material Y was stacked on the upper surface of the thin hole transporting organic layer as the substrate X, heated and pressed at 160° C. under 0.3 MPa at 0.05 m/min by using a pair of hot rollers and the provisional support was peeled to form a thin light emitting organic layer on the upper surface of the substrate X. This is referred to as the substrate XY. Further, a patterned mask for vapor deposition (a mask providing a light emitting area of 5 mm×5 mm) was placed on one surface of a polyimide film of 50 μm thickness (UPILEX-50S, manufactured by Ube Kosan Co.) cut into 25 mm square, to which Al was vapor deposited in a reduced pressure atmosphere at about 0.1 mPa to form an electrode of 0.3 μm thickness. $Al_2O_3$ was vapor deposited in the same pattern as the Al layer by a DC magnetron sputtering method using an $Al_2O_3$ target to a film thickness of 3 nm. An aluminum lead wire was connected from the Al electrode, to form a laminate structure. A coating solution for use in a thin electron transporting organic layer having the following composition was coated on the obtained laminate structure by a spin coater coating machine and dried in vacuum at 80° C. for 2 hours to form a thin electron transporting organic layer of 15 nm thickness. This is referred to as a substrate Z.

Composition

| | |
|---|---|
| Polyvinyl butyral 2000 L (MW = 2000, manufacture by Denki Kagaku Kogyo Co.) | 10 mass parts |
| 1-butanol | 3500 mass parts |
| Electron transporting compound having the following structure (synthesized by the method described in JP-A-2001-335776) | 20 mass parts |

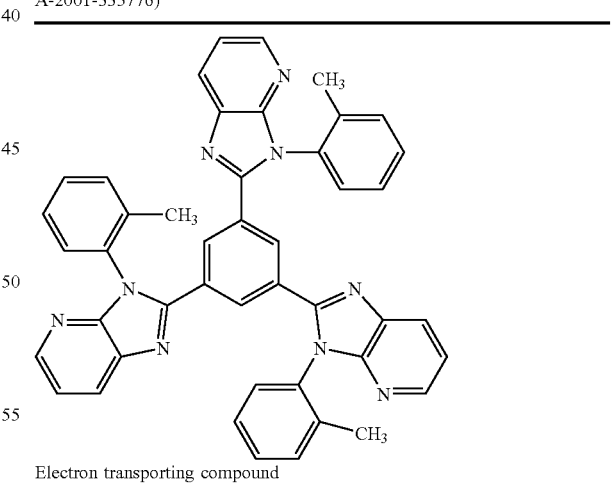

Electron transporting compound

The substrate XY and the substrate Z were used, stacked such that the electrodes were opposed to each other while sandwiching the thin light emitting organic layer therebetween, and bonded by heating and pressing at 160° C. and 0.3 MPa, at 0.05 m/min using a pair of hot rollers. The two sheets of substrate films were sealed by using a commercially available UV-curing sealant for use in organic EL so as to surround the light emitting organic layer (organic EL layer). Further, the obtained laminate structure was covered with silicon nitride except for the portion of lead wires by a sputtering method, to obtain an organic EL device.

When a DC current was applied to the obtained organic EL device using a source measure unit model 2400 (manufactured by Toyo Technica Co.) to emit light, the device emitted light satisfactorily. Then, after preparing the organic EL device using the gas barrier film described above, it was left at 60° C.·90% RH for 500 hours to emit light in the same manner, and the area of the light emitting portion for the entire device (not-light emitting portion was dark spots) was determined by using a micro analyzer manufactured by Nippon Poladigital Co. The light permeability of the film (at 550 nm) was 88.5% and the light emitting area ratio after lapse of time of the organic EL sample was excellent as 100%.

(4) Evaluation for Conductivity Characteristic

The conductivity of the Samples 1-1 to 1-8 manufactured by changing the coating amount of the metal oxides as described in Table 1 and the antistatic characteristic thereof were examined by the method described above.

(4-1) Evaluation for Internal Conductivity

Each sample was cut into 1 cm×5 cm under the circumstance at 25° C.·60% RH and a silver paint was coated on longer side edge and dried sufficiently. Then, electrode terminals were placed to the silver paint portion and the resistance therebetween was measured by a resistance tester.

(4-2) Evaluation for Dust Deposition

Samples each of 20 cm×20 cm were manufactured and put to humidity control for three days under the circumstance at 25° C.·25% RH. The conductivity-provided surface of the sample after humidity control was rubbed with a nylon cloth (5 cm×5 cm) applied with a weight of 1 kg in total for the sample surface (10 cm×5 cm) by ten times to apply static charges. The obtained samples were placed 5 sec after on previously collected tobacco ashes with the rubbed surface being placed thereabove at 1 cm distance and the deposition state of tobacco ashes was visually observed. Evaluation was made according to the following four steps A-D. The evaluation shows that the antistatic characteristics are excellent in the order of A, B, C, and D.

A: No particular deposition of tobacco ashes was observed
B: Slight deposition of tobacco ashes was observed
C: Considerable deposition of tobacco ashes was observed
D: Remarkable deposition of tobacco ashes was observed (4-3) Evaluation for Film Adherance Samples each of 20 cm×20 cm was prepared and put to humidity control under the circumstance at 25° C.·60% RH or under the circumstance at 25° C.·10% RH for three days. Both surfaces of the sample after humidity control under the same circumstantial condition were brought into contact and the samples were transported for 5 cm in one direction while being applied with a weight of 5 kg entirely, and rubbed by 10 times in total to apply static charges. The obtained samples were disposed vertically and the state where one of the films dropped relative to the other was visually observed and evaluated in accordance with the following four steps A-D. The evaluation shows that the antistatic characteristic is excellent in the order of A, B, C, and D.

A: One of the films dropped instantaneously
B: One of the films dropped in a short time
C: One of the films is in a state being displaced slightly but adhered
D: One of the films is in a firmly adhered (4-4) Result As shown in Table 1, Sample 1-1 not containing the conductive metal oxide at all or Comparative Samples 1-2 to 1-4 with less content thereof showed high resistance value and were poor in view of the dust deposition and film adherance and poor in the handlability. On the contrary, the Samples 1-5 to 1-8 of the invention showing the conductivity of the invention were satisfactory in view of the result for the evaluation of dust deposition and evaluation of film adherance. Particularly, the film adherance was excellent also under the low humidity circumstance.

TABLE 1

| Sample | Content | Coating amount of metal oxide (g/m²) | Resistance (Ω) | Evaluation for dust deposition | Evaluation for film adherance (25° C./0% RH) | Evaluation for film adherance (25° C./10% RH) |
|---|---|---|---|---|---|---|
| 1-1 | Control | 0 | >1 × 10$^{15}$ | D | D | D |
| 1-2 | Comparison | 0.01 | >1 × 10$^{15}$ | D | D | D |
| 1-3 | Comparison | 0.06 | 9.5 × 10$^{14}$ | D | D | D |
| 1-4 | Comparison | 0.09 | 3.8 × 10$^{12}$ | C | B | D |
| 1-5 | Invention | 0.15 | 5.4 × 10$^{11}$ | B | B | C |
| 1-6 | Invention | 0.18 | 1.6 × 10$^{10}$ | A | A | A |
| 1-7 | Invention | 0.2 | 2.1 × 10$^9$ | A | A | A |
| 1-8 | Invention | 0.8 | 6.3 × 10$^6$ | A | A | A |
| 2-1 | Invention | 0.2 | 2.3 × 10$^9$ | A | A | A |
| 2-2 | Invention | 0.2 | 1.7 × 10$^9$ | A | A | A |
| 2-3 | Invention | 0.2 | 1.9 × 10$^9$ | A | A | A |
| 2-4 | Invention | 0.2 | 2.1 × 10$^9$ | A | A | A |
| 2-5 | Invention | 0.2 | 1.9 × 10$^9$ | A | A | A |
| 2-6 | Invention | 0.2 | 1.8 × 10$^9$ | A | A | A |
| 2-7 | Invention | 0.2 | 1.9 × 10$^9$ | A | A | A |
| 3-1 | Invention | 0.2 | 2.1 × 10$^9$ | A | A | A |
| 3-2 | Invention | 0.2 | 1.6 × 10$^9$ | A | A | A |
| 3-3 | Invention | 0.2 | 2.6 × 10$^9$ | A | A | A |
| 3-4 | Invention | 0.2 | 2.0 × 10$^9$ | A | A | A |
| 3-5 | Invention | 0.2 | 2.2 × 10$^9$ | A | A | A |
| 4-1 | Invention | 0.25 | 8.6 × 10$^8$ | A | A | A |
| 4-2 | Invention | 0.3 | 7.6 × 10$^9$ | A | A | A |

TABLE 1-continued

| Sample | Content | Coating amount of metal oxide (g/m$^2$) | Resistance (Ω) | Evaluation for dust deposition | Evaluation for film adherance (25° C./0% RH) | Evaluation for film adherance (25° C./10% RH) |
|---|---|---|---|---|---|---|
| 4-3 | Invention | 0.3 | 2.6 × 10$^8$ | A | A | A |
| 4-4 | Invention | 0.4 | 8.6 × 10$^9$ | A | A | A |
| 4-5 | Invention | 0.2 | 3.8 × 10$^8$ | A | A | A |

Example 2

Samples 2-1 to 2-7 of the invention were manufactured quite in the same manner as in Sample 1-7 of Example 1 except for changing the layer constitution as described below in Sample 1-7. Table 1 describes the result of practicing the respective evaluations for the characteristics in the same manner as in Example 1. All of the obtained samples of the invention were excellent in the result of evaluation for the conductivity, dust deposition and film adherance.

Constitution of Sample 2-1:
Substrate film/inorganic barrier gas layer (50 nm)/adjacent organic layer (500 nm)/adjacent organic layer (500 nm)/inorganic gas barrier (50 nm)/adjacent organic layer (500 nm)/conductive layer Constitution of Sample 2-2:
Substrate film/inorganic gas barrier layer (50 nm)/adjacent organic layer (500 nm)/hygroscopic layer/adjacent organic layer (500 nm)/inorganic gas barrier (50 nm)/adjacent organic layer (500 nm)/conductive layer Constitution of Sample 2-3:
Substrate film/inorganic gas barrier layer (50 nm)/adjacent organic layer (500 nm)/hygroscopic layer/((adjacent organic layer (500 nm)/inorganic gas barrier (50 nm))×2/adjacent organic layer (500 nm)/conductive layer Constitution of Sample 2-4:
Substrate film/(inorganic gas barrier layer (50 nm)/adjacent organic layer (500 nm))×2/hygroscopic layer/((adjacent organic layer (500 nm)/inorganic gas barrier (50 nm))×2/conductive layer Constitution of Sample 2-5:
Inorganic gas barrier layer (50 nm)/adjacent organic layer (500 nm)/inorganic gas barrier layer (50 nm)/substrate film/(inorganic gas barrier layer (50 nm)/adjacent organic layer (500 nm))×2/hygroscopic layer/((adjacent organic layer (500 nm)/inorganic gas barrier (50 nm))×2/conductive layer Constitution of Sample 2-6:
Substrate film/(inorganic gas barrier layer (50 nm)/adjacent organic layer (500 nm))×2/hygroscopic layer/adjacent organic layer (500 nm)/conductive layer Constitution of Sample 2-7
Substrate film/hygroscopic layer/adjacent organic layer (500 nm)/(inorganic gas barrier layer (50 nm)/adjacent organic layer (500 nm))×2/conductive layer Example 3

Samples 3-1 to 3-5 of the invention were manufactured quite in the same manner as in Sample 1-7 of Example 1 except for changing the resin compound of the (1-1) substrate film to CP-2, CP-3, HP-2, PB-1 and CP-6 of the invention in Sample 1-7. Table 1 describes the result of practicing the respective evaluation for characteristics in the same manner as in Example 1. All of the obtained samples of the invention were excellent in the result of evaluation for the conductivity, dust deposition and film adherance.

Example 4

Samples 4-1 to 4-5 of the invention were manufactured quite in the same manner as in Sample 1-7 of Example 1 except for changing the formation of the (2-5) conductive layer as described below in Sample 1-7. Table 1 describes the result of practicing the respective evaluation for characteristics in the same manner as in Example 1. All of the obtained samples of the invention were excellent in the result of evaluation for the conductivity, dust deposition and film adherance.

Formation of Conductive Layer of Sample 4-1

| | |
|---|---|
| Indium oxide-antimony oxide composite compound with an average primary grain size of 12 nm (antimony oxide content: 5 mol %, specific resistivity: 1 Ω · cm, acetone dispersion of finely particulate powder (secondary agglomerate grain size: about 45 nm)) | 0.2 g/m$^2$ (solid content) |
| Triacetyl cellulose (acetylation degree: 2.60, polymerization degree: 305) | 0.05 g/m$^2$ |
| Poly(polymerization degree: 10) oxyethylene-stearyl ether | 0.001 g/m$^2$ |

The conductive solution was prepared such that triacetyl cellulose was 5% by volume in acetone and coated by an appropriate bar coater so as to be a desired coating amount.

Formation of Conductive Layer of Sample 4-2

| | |
|---|---|
| Tin oxide-antimony oxide composite compound sol (antimony oxide content: 5 mol %, specific resistivity: 1 Ω · cm, methanol/water (9/1 mass ratio) dispersion of finely particulate powder/water) | 0.3 g/m$^2$ (solid content) |
| Triacetyl cellulose (acetylation degree: 2.60, polymerization degree 305) | 0.05 g/m$^2$ |
| Poly(polymerization degree: 10) oxyethylene-stearyl ether | 0.001 g/m$^2$ |

The conductive solution was prepared such that triacetyl cellulose was 5% by volume in acetone and coated by an appropriate bar coater so as to be a desired coating amount.

Formation of Conductive Layer of Sample 4-3

| | |
|---|---|
| Vanadium pentoxide-silver composite compound with an average minor axis length of 5 nm and an average major axis length of 0.5 μm (silver content: 7 mol %, | 0.18 g/m$^2$ (solid content) |

-continued

| | |
|---|---|
| specific resistivity: 2 Ω · cm, acetone dispersion of finely particulate powder) | |
| Triacetyl cellulose (acetylation degree: 2.60, polymerization degree: 305) | 0.05 g/m² |
| Poly(polymerization degree: 10) oxyethylene-stearyl ether | 0.001 g/m² |

The conductive solution was prepared such that triacetyl cellulose was 5% by volume in acetone and coated by an appropriate bar coater so as to be a desired coating amount.

Formation of Conductive Layer of Sample 4-4

| | |
|---|---|
| Polyaniline with an average primary grain size of 18 nm (specific resistivity: 5500 Ω · cm, acetone dispersion of finely particulate powder (secondary agglomerate grain size: about 86 nm)) | 0.4 g/m² (solid content) |
| Triacetyl cellulose (acetylation degree: 2.60, polymerization degree: 305) | 0.05 g/m² |
| Poly(polymerization degree: 10) oxyethylene-stearyl ether | 0.001 g/m² |

The conductive solution was prepared such that triacetyl cellulose was 5% by volume in acetone and coated by an appropriate bar coater so as to be a desired coating amount.

Formation of Conductive Layer of Sample 4-5

| | |
|---|---|
| Acicular tin oxide-antimony oxide composite (antimony oxide content: 10 mol %, specific resistivity: 5 Ω · cm an average major axis length: 1.1 μm, and an average minor axis length: 20 μm, acetone dispersion of finely particulate powder) | 0.2 g/m² (solid content) |
| Triacetyl cellulose (acetylation degree: 2.60, polymerization degree: 305) | 0.05 g/m² |
| Poly(polymerization degree: 10) oxyethylene-stearyl ether | 0.001 g/m² |

The conductive solution was prepared such that triacetyl cellulose was 5% by volume in acetone and coated by an appropriate bar coater so as to be a desired coating amount.

Since the steam barrier film having the conductive layer of the invention less suffers from dust deposition, has excellent transparency and barrier property and is also excellent in the antistatic characteristic, it is used suitably as substrates for various kinds of devices and a coating film for device. Particularly, the invention is useful since it can provide a steam barrier film of high transparency. Further, the substrate for use in the image display device and the organic EL device of the invention has high durability and flexibility, and excellent antistatic characteristic, and the invention is highly applicable industrially.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A steam barrier film comprising at least one hygroscopic layer containing a monoxide of group II metal and at least one inorganic gas barrier layer on a polyalkylene naphthalate resin substrate film in which the glass transition temperature (Tg) of the polyalkylene naphthalate resin is from 70 to 150° C. and the steam barrier film comprises at least one conductive layer with a resistance of $10^{12} \Omega$ or less at 25° C. and 60% relative humidity.

2. The steam barrier film according to claim 1, wherein the inorganic gas barrier layer contains an oxide, nitride or oxynitride containing at least one metal selected from the group consisting of Si, Al, In, Sn, Zn, Ti, Cu, Ce and Ta.

3. The steam barrier film according to claim 1, wherein the substrate film is transparent and comprises a polyalkylene naphtharate resin with the glass transition temperature of from 85 to 150° C.

4. The steam barrier film according to claim 1, wherein the polyalkylene naphthalate resin substrate film is a polyethylene naphthalate film.

5. The steam barrier film according to claim 1, wherein the conductive layer contains at least one inorganic conductive metal oxide and/or at least one organic conductive material.

6. The steam barrier film according to claim 5, wherein the conductive metal oxide is $ZnO$, $TiO_2$, $SnO_2$, $Al_2O_3$, $In_2O_3$, $SiO_2$, $MgO$, $BaO$, $MoO_2$, $V_2O_5$ or a composite oxide thereof and the metal oxide may also contain a hetero-atom selected from the group consisting of Al, In, Ta, Sb, Nb, Ag, Cl, Br, and I.

7. The steam barrier film according to claim 6, which comprises at least two inorganic gas barrier layers and wherein the at least one hygroscopic layer comprises a monoxide of group II metal between the inorganic gas barrier layers.

8. The steam barrier film according to claim 7, which comprises at least one adjacent organic layer in a position adjacent to the inorganic gas barrier layer and/or the hygroscopic layer.

9. The steam barrier film according to claim 8, wherein the hygroscopic layer contains at least one metal oxide comprising Be, Mg, Ca, Sr, Ba or Ra.

10. The steam barrier film according to claim 7, wherein the hygroscopic layer contains at least one metal oxide comprising Be, Mg, Ca, Sr, Ba or Ra.

11. The steam barrier film according to claim 6, which comprises at least one adjacent organic layer in a position adjacent to the inorganic gas barrier layer and/or the hygroscopic layer.

12. The steam barrier film according to claim 1, which comprises at least two inorganic gas barrier layers and wherein the at least one hygroscopic layer comprises a monoxide of group II metal between the inorganic gas barrier layers.

13. The steam barrier film according to claim 12, which comprises at least one adjacent organic layer in a position adjacent to the inorganic gas barrier layer and/or the hygroscopic layer.

14. The steam barrier film according to claim 13, wherein the hygroscopic layer contains at least one metal oxide comprising Be, Mg, Ca, Sr, Ba or Ra.

15. The steam barrier film according to claim 12, wherein the hygroscopic layer contains at least one metal oxide comprising Be, Mg, Ca, Sr, Ba or Ra.

16. The steam barrier film according to claim 1, which comprises at least one adjacent organic layer in a position adjacent to the inorganic gas barrier layer and/or the hygroscopic layer.

17. An optical display material comprising the steam barrier film according to claim 1.

18. A steam barrier film comprising at least one hygroscopic layer and at least one inorganic gas barrier layer on a polyalkylene naphthalate resin substrate film in which the glass transition temperature (Tg) of the polyalkylene naphthalate resin is from 70 to 150° C. and the steam barrier film comprises at least one conductive layer with a resistance of $10^2 \Omega$ or less at 25° C. and 60% relative humidity.

* * * * *